(12) United States Patent
Hopewell et al.

(10) Patent No.: US 10,341,032 B2
(45) Date of Patent: *Jul. 2, 2019

(54) HIGH-BANDWIDTH UNDERWATER DATA COMMUNICATION SYSTEM

(71) Applicant: Fairfield Industries Incorporated, Sugar Land, TX (US)

(72) Inventors: William Hopewell, Missouri City, TX (US); Philip Lacovara, Tucson, AZ (US); Michael Morris, Sugar Land, TX (US)

(73) Assignee: Magseis FF LLC, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/664,707

(22) Filed: Jul. 31, 2017

(65) Prior Publication Data

US 2018/0034558 A1 Feb. 1, 2018

Related U.S. Application Data

(63) Continuation of application No. 15/237,106, filed on Aug. 15, 2016, now Pat. No. 9,825,713, which is a
(Continued)

(51) Int. Cl.
*H04B 10/80* (2013.01)
*H04B 10/2575* (2013.01)
(Continued)

(52) U.S. Cl.
CPC ......... *H04B 13/02* (2013.01); *H04B 10/2575* (2013.01); *H04B 10/50* (2013.01);
(Continued)

(58) Field of Classification Search
CPC .. H04B 10/80; H04B 10/2575; H04L 27/2601
(Continued)

(56) References Cited

U.S. PATENT DOCUMENTS 3,243,592 A 3/1966 Kyi et al.
4,394,573 A 7/1983 Correa et al.
(Continued)

FOREIGN PATENT DOCUMENTS

CN 101228719 7/2008
CN 102098112 6/2011
(Continued)

OTHER PUBLICATIONS

Simpson ["Smart Transmitters and Receivers for Underwater Free-Space Optical Communication" IEEE Journal on Selected Areas in Communications, Jun. 2012].*
(Continued)

*Primary Examiner* — Oommen Jacob
(74) *Attorney, Agent, or Firm* — Foley & Lardner LLP; James De Vellis

(57) ABSTRACT

An apparatus is described which uses directly modulated InGaN Light-Emitting Diodes (LEDs) or InGaN lasers as the transmitters for an underwater data-communication device. The receiver uses automatic gain control to facilitate performance of the apparatus over a wide-range of distances and water turbidities.

20 Claims, 12 Drawing Sheets

Related U.S. Application Data continuation of application No. 14/203,550, filed on Mar. 10, 2014, now Pat. No. 9,490,911, which is a continuation-in-part of application No. 13/843,942, filed on Mar. 15, 2013, now Pat. No. 9,490,910.

(51) Int. Cl.
  *H04B 10/11* (2013.01)
  *H04B 13/02* (2006.01)
  *H04L 27/26* (2006.01)
  *H04B 10/50* (2013.01)
  *H04B 10/564* (2013.01)
  *H03G 3/30* (2006.01)

(52) U.S. Cl.
  CPC .......... *H04B 10/564* (2013.01); *H04B 10/80* (2013.01); *H04L 27/2601* (2013.01); *H03G 3/3084* (2013.01); *H04L 27/2697* (2013.01)

(58) Field of Classification Search
  USPC ................................................ 398/104, 105
  See application file for complete search history.

(56) References Cited

U.S. PATENT DOCUMENTS

| | | | |
|---|---|---|---|
| 4,434,364 A | 2/1984 | Correa et al. | |
| 4,525,818 A | 6/1985 | Cielo et al. | |
| 4,995,101 A | 2/1991 | Titterton et al. | |
| 5,038,406 A | 8/1991 | Titterton et al. | |
| 5,111,051 A | 5/1992 | Watanabe | |
| 5,142,400 A | 8/1992 | Solinsky | |
| 5,267,070 A | 11/1993 | Stewart et al. | |
| 5,301,167 A | 4/1994 | Proakis et al. | |
| 5,481,158 A | 1/1996 | Kato et al. | |
| 5,559,757 A | 9/1996 | Catipovic et al. | |
| 5,619,100 A | 4/1997 | Kyushima et al. | |
| 5,637,959 A | 6/1997 | Kyushima et al. | |
| 6,002,646 A | 12/1999 | Reid et al. | |
| 6,089,456 A | 7/2000 | Walsh et al. | |
| 6,580,541 B1 | 6/2003 | Yamashita et al. | |
| 6,603,124 B2 | 8/2003 | Maublant | |
| 6,625,083 B2 | 9/2003 | Vandenbroucke | |
| 7,016,260 B2 | 3/2006 | Bary | |
| 7,184,670 B2 | 2/2007 | Townsend et al. | |
| 7,223,962 B2 | 5/2007 | Fageraas et al. | |
| 7,261,162 B2 | 8/2007 | Deans et al. | |
| 7,298,672 B1 | 11/2007 | Tenghamn et al. | |
| 7,366,055 B2 | 4/2008 | Ronnekleiv et al. | |
| 7,417,924 B2 | 8/2008 | Vigen et al. | |
| 7,621,229 B2 | 11/2009 | Bowen et al. | |
| 7,646,670 B2 | 1/2010 | Maxwell et al. | |
| 7,660,189 B2 | 2/2010 | Vigen et al. | |
| 7,660,192 B2 | 2/2010 | Paulsen | |
| 7,660,206 B2 | 2/2010 | Berg et al. | |
| 7,711,322 B2 | 5/2010 | Rhodes et al. | |
| 7,755,971 B2 | 7/2010 | Heatley et al. | |
| 7,796,466 B2 | 9/2010 | Combee et al. | |
| 7,826,794 B2 | 11/2010 | Rhodes et al. | |
| 7,835,221 B2 | 11/2010 | Vigen et al. | |
| 7,853,206 B2 | 12/2010 | Rhodes et al. | |
| 7,854,569 B1 | 12/2010 | Stenson et al. | |
| 7,859,944 B2 | 12/2010 | Zhou et al. | |
| 7,873,278 B2 | 1/2011 | Baiden | |
| 7,873,316 B2 | 1/2011 | Rhodes et al. | |
| 7,877,059 B2 | 1/2011 | Rhodes et al. | |
| 7,953,326 B2 | 5/2011 | Farr et al. | |
| 8,045,859 B2 | 10/2011 | Bandyopadhyay | |
| 8,045,919 B2 | 10/2011 | Rhodes et al. | |
| 8,055,193 B2 | 11/2011 | Rhodes et al. | |
| 8,115,620 B2 | 2/2012 | Breed | |
| 8,131,213 B2 | 3/2012 | Porter et al. | |
| 8,219,024 B2 | 7/2012 | Rhodes et al. | |
| 8,233,801 B2 | 7/2012 | Sexton et al. | |
| 8,279,714 B2 | 10/2012 | Paul et al. | |
| 8,295,708 B2 | 10/2012 | Bandyopadhyay | |
| 8,299,424 B2 | 10/2012 | Camilli | |
| 8,301,027 B2 | 10/2012 | Shaw et al. | |
| 8,305,227 B2 | 11/2012 | Jaffrey et al. | |
| 8,310,899 B2 | 11/2012 | Woodard et al. | |
| 8,315,560 B2 | 11/2012 | Rhodes et al. | |
| 8,326,219 B2 | 12/2012 | Rhodes et al. | |
| 8,326,220 B2 | 12/2012 | Rhodes et al. | |
| 8,331,856 B2 | 12/2012 | Rhodes et al. | |
| 8,335,469 B2 | 12/2012 | Rhodes et al. | |
| 8,340,526 B2 | 12/2012 | Camilli et al. | |
| 8,346,164 B2 | 1/2013 | Rhodes et al. | |
| 8,346,165 B2 | 1/2013 | Rhodes et al. | |
| 8,358,973 B2 | 1/2013 | Rhodes et al. | |
| 8,364,078 B2 | 1/2013 | Rhodes et al. | |
| 8,385,821 B2 | 2/2013 | Rhodes et al. | |
| 8,417,183 B2 | 4/2013 | Rhodes et al. | |
| 8,440,958 B2 | 5/2013 | Bandyopadhyay | |
| 8,457,498 B2 | 6/2013 | Stewart | |
| 8,515,343 B2 | 8/2013 | Rhodes et al. | |
| 8,515,344 B2 | 8/2013 | Rhodes et al. | |
| 8,547,036 B2 | 10/2013 | Tran | |
| 8,611,181 B2 | 12/2013 | Woodward et al. | |
| 8,670,293 B2 | 3/2014 | Morozov | |
| 8,682,244 B2 | 3/2014 | Rhodes et al. | |
| 8,750,707 B2 | 6/2014 | Sabet et al. | |
| 8,813,669 B2 | 8/2014 | Race et al. | |
| 8,867,315 B2 | 10/2014 | Paul et al. | |
| 8,953,911 B1 | 2/2015 | Xu et al. | |
| 8,953,944 B2 | 2/2015 | Machado et al. | |
| 9,031,413 B2 | 5/2015 | Doniec et al. | |
| 9,037,079 B2 | 5/2015 | Wolfe et al. | |
| 9,086,325 B2 | 7/2015 | Nash et al. | |
| 9,154,234 B2 | 10/2015 | Motley | |
| 9,192,030 B2 | 11/2015 | Tran | |
| 9,203,342 B2 | 12/2015 | Rongve et al. | |
| 9,203,524 B2 | 12/2015 | Simpson et al. | |
| 9,231,708 B2 | 1/2016 | Farr et al. | |
| 9,294,201 B2 | 3/2016 | Farr et al. | |
| 9,490,910 B2 | 11/2016 | Lacovara | |
| 9,490,911 B2 * | 11/2016 | Hopewell | H04B 10/80 |
| 9,825,713 B2 * | 11/2017 | Hopewell | H04B 10/80 |
| 2002/0110048 A1 | 8/2002 | Vandenbroucke | |
| 2002/0179364 A1 | 12/2002 | Bussear et al. | |
| 2003/0036351 A1 | 2/2003 | Forbes | |
| 2003/0111611 A1 | 6/2003 | Maublant | |
| 2003/0117893 A1 | 6/2003 | Bary | |
| 2004/0016867 A1 | 1/2004 | Milshtein et al. | |
| 2004/0208514 A1 | 10/2004 | Zhang et al. | |
| 2005/0088916 A1 | 4/2005 | Zhu et al. | |
| 2005/0232634 A1 | 10/2005 | Evangelides et al. | |
| 2005/0232638 A1 | 10/2005 | Fucile et al. | |
| 2006/0001428 A1 | 1/2006 | Milne et al. | |
| 2006/0008275 A1 | 1/2006 | Lacovara et al. | |
| 2006/0062099 A1 | 3/2006 | Yazaki et al. | |
| 2006/0159524 A1 | 7/2006 | Thompson et al. | |
| 2006/0286931 A1 | 12/2006 | Rhodes et al. | |
| 2007/0183782 A1 * | 8/2007 | Farr | H04B 13/02 398/104 |
| 2008/0129510 A1 | 6/2008 | Tuttle | |
| 2008/0144442 A1 * | 6/2008 | Combee | G01V 1/22 367/131 |
| 2008/0205892 A1 | 8/2008 | Baiden | |
| 2009/0045741 A1 | 2/2009 | Kyushima et al. | |
| 2009/0067289 A1 | 3/2009 | Lee et al. | |
| 2009/0074422 A1 | 3/2009 | Stewart | |
| 2009/0208219 A1 * | 8/2009 | Rhodes | H04B 13/02 398/104 |
| 2009/0214224 A1 * | 8/2009 | Cho | H04B 10/61 398/188 |
| 2009/0274465 A1 | 11/2009 | Bandyopadhyay | |
| 2010/0008666 A1 | 1/2010 | Kovsh et al. | |
| 2010/0014618 A1 | 1/2010 | Tsukio et al. | |
| 2010/0133443 A1 | 6/2010 | Ohtani | |
| 2010/0212574 A1 | 8/2010 | Hawkes et al. | |
| 2010/0227551 A1 | 9/2010 | Volanthen et al. | |
| 2010/0227552 A1 | 9/2010 | Volanthen et al. | |
| 2011/0005801 A1 | 1/2011 | Olivier et al. | |
| 2011/0058814 A1 | 3/2011 | Camilli et al. | |

(56) References Cited

U.S. PATENT DOCUMENTS

| | | | |
|---|---|---|---|
| 2011/0076940 | A1 | 3/2011 | Rhodes et al. |
| 2011/0222374 | A1 | 9/2011 | Berg et al. |
| 2011/0229141 | A1 | 9/2011 | Chave et al. |
| 2011/0300008 | A1 | 12/2011 | Fielder et al. |
| 2011/0300794 | A1 | 12/2011 | Rhodes et al. |
| 2012/0017989 | A1 | 1/2012 | Chang et al. |
| 2012/0099399 | A1 | 4/2012 | Lichter et al. |
| 2012/0105246 | A1 | 5/2012 | Sexton et al. |
| 2012/0170935 | A1 | 7/2012 | MacHado et al. |
| 2012/0177367 | A1 | 7/2012 | Miller |
| 2012/0263476 | A1 | 10/2012 | Sabet et al. |
| 2012/0325919 | A1 | 12/2012 | Warren et al. |
| 2013/0010612 | A1 | 1/2013 | Lee et al. |
| 2013/0187787 | A1 | 7/2013 | Damus et al. |
| 2013/0271088 | A1 | 10/2013 | Hwang et al. |
| 2013/0279299 | A1 | 10/2013 | Rhodes et al. |
| 2013/0330083 | A1 | 12/2013 | Song et al. |
| 2014/0051352 | A1 | 2/2014 | Wolfe et al. |
| 2014/0086008 | A1 | 3/2014 | Pharris et al. |
| 2014/0161466 | A1 | 6/2014 | Riza |
| 2014/0198607 | A1 | 7/2014 | Etienne et al. |
| 2014/0212142 | A1 | 7/2014 | Doniec et al. |
| 2014/0254649 | A1 | 9/2014 | Afkhami et al. |
| 2014/0301161 | A1 | 10/2014 | Brizard et al. |
| 2014/0341584 | A1 | 11/2014 | Hopewell et al. |
| 2014/0363166 | A1 | 12/2014 | Lacovara |
| 2015/0000582 | A1 | 1/2015 | Lelaurin et al. |
| 2015/0132004 | A1 | 5/2015 | Farr et al. |
| 2015/0188695 | A1 | 7/2015 | Crowell |
| 2015/0372769 | A1 | 12/2015 | Farr et al. |
| 2016/0041280 | A1 | 2/2016 | Naes et al. |
| 2016/0094298 | A1 | 3/2016 | Isfeldt et al. |
| 2016/0121009 | A1 | 5/2016 | Farr et al. |
| 2016/0127042 | A1 | 5/2016 | Farr et al. |
| 2016/0170060 | A1 | 6/2016 | Hopewell et al. |
| 2016/0349387 | A1 | 12/2016 | Rokkan et al. |

FOREIGN PATENT DOCUMENTS

| | | |
|---|---|---|
| CN | 102916744 | 2/2013 |
| CN | 103095380 | 5/2013 |
| CN | 104038292 | 9/2014 |
| CN | 204103926 | 1/2015 |
| CN | 104618032 | 5/2015 |
| EP | 1 891 457 | 2/2008 |
| EP | 1 891 762 | 2/2008 |
| EP | 2 341 644 | 7/2011 |
| EP | 2 362 559 | 8/2011 |
| EP | 2 657 723 | 10/2013 |
| EP | 2 866 051 | 4/2015 |
| EP | 2 913 942 | 9/2015 |
| GB | 2 511 938 | 7/2016 |
| JP | 6139640 | 2/1986 |
| RU | 2431868 C1 | 10/2011 |
| WO | WO-2010/021810 | 2/2010 |
| WO | WO-2011/139159 | 11/2011 |
| WO | WO-2012/123698 | 9/2012 |
| WO | WO-2013/160475 | 10/2013 |

OTHER PUBLICATIONS

"WHOI Scientists and Engineers Partner with World-Renowned Companies to Market Revolutionary New Instruments," www.whoi.edu, Jul. 19, 2012.
Akyildiz, Ian F., "Challenges for Efficient Communication in Underwater Acoustic Sensor Networks", ACM Sigbed Review 1.2 (2004), pp. 3-8.
Ambalux Corporation Company Information, 2010.
Arnon, S. et al., "Non-line-of-sight underwater optical wireless communication network", J. Opt. Soc. Am. A, 26.3 (2009), pp. 530-539.
Bajwa, Navneet et al., "Smart Transmitters and Receivers for Underwater Free-Space Optical Communication—A Review," International Conference on Communications, Computing & Systems, 2014.
Brundage, Heather, "Designing a Wireless Underwater Optical Communication System," Feb. 2010.
Cox Jr., William C., "A 1 Mpbs Underwater Communication System Using a 405 nm Laser Diode and Photomultiplier Tube," 2007.
David Wilson, Woods Hole researchers develop sub-sea comms system, pp. 1-2, 12 Jul. 2010, The Engineer.co.uk.
Destrez et al., "Underwater High Bit-Rate Optical Free-Space Communication System," International Workshop on Optical Wireless Communications (IWOW), 2012.
Drakeley, B. et al., "Permanent ocean bottom seismic systems to improve reservoir management", Offshore 63.1, Jan. 2003, 4 pages.
European Extended Search Report for EP 14798429.8 dated Aug. 10, 2016.
Examination Report for AU 2014265955 dated Mar. 16, 2017.
Fairfield Nodal—Permanent Monitoring Presentation, Nov. 27, 2012.
Gabriel, Chadi et al., "Journal of Optical Communications and Networking," Archimer, vol. 5, Issue 1, Jan. 2013.
Gabriel, Chadi et al., "Optical Communication System for an Underwater Wireless Sensor Network," EGU General Assembly, Apr. 2012.
Gabriel, Chadi, et al., "Channel Modeling for Underwater Optical Communication," IEEE Global Communications Conference, Dec. 2011.
Garcia-Hernandez, C. F. et al., "Wireless Sensor Networks and Applications: A Survey", ICSNS International Journal of Computer Science and Network Security,7.3, (2007), p. 264-273.
Giles, John W., "Underwater Optical Communication Systems: Part 2: Basic Design Consideration," IEEEE Military Communications Conference, 2005.
Grattan et al., Optical Fiber Sensor Technology: Fundamentals, 2000, Springer Science Business Media, p. 287.
Hammock,D, "Multiple-anode PMT behaves like many detectors in one," May 1, 2001,(7 pages) Laser Focus World.
Hanson, Frank, et al., "High Bandwidth Underwater Optical Communication," Applied Optics, vol. 47, No. 2, Jan. 10, 2008.
High Data Rate Underwater Laser Communications, Longacre et al., 1302 Ocean Optics X, SPIE, 1990 (14 pages).
International Search Report and Written Opinion for PCT/US2017/038166 dated Dec. 13, 2018.
International Search Report and Written Opinion in International Application No. PCT/US2014/024392 dated Nov. 25, 2014 (8 pages).
Minev, P. et al, Short-Range Optical OFDM, Newcastle University School of Electrical and Electronic Engineering, 2012, 5 pages.
Non-Final Office Action in U.S. Appl. No. 13/843,942 dated Oct. 15, 2014 (32 pages).
Notice of Allowance on U.S. Appl. No. 13/843,942 dated Aug. 17, 2016.
Notice of Allowance on U.S. Appl. No. 14/203,550 dated Sep. 16, 2016.
Notice of Allowance on U.S. Appl. No. 15/081,627 dated Aug. 28, 2017.
Notice of Allowance on U.S. Appl. No. 15/081,627 dated Sep. 14, 2017.
Notice of Allowance on U.S. Appl. No. 15/081,627 dated Jan. 3, 2018.
Notice of Allowance on U.S. Appl. No. 15/237,106 dated Sep. 12, 2017.
Office Action on U.S. Appl. No. 15/237,106 dated Jun. 15, 2017.
Office Action on U.S. Appl. No. 15/334,486 dated Aug. 24, 2017.
Office Action on U.S. Appl. No. 15/334,486 dated Apr. 3, 2018.
Office Action on U.S. Appl. No. 15/664,697 dated Sep. 20, 2017.
Office Action on U.S. Appl. No. 15/664,697 dated Mar. 29, 2018.
Optical system promises to revolutionize undersea communications, pp. 1-3, Feb. 23, 2010, Woods Hole Oceanographic Institution News Release.

(56) References Cited

OTHER PUBLICATIONS

Russian Office Action and Search Report and English translation issued in application No. 2015141623/07(064280) dated Oct. 13, 2016.
Sackinger, E., Broadband Circuit for Optical Fiber Communication, Wiley-Interscience, 2005, 46 pages.
Simpson et al., "Smart Transmitters and Receivers for Underwater Free-Space Optical Communication," IEEE Journal on Selected Areas in Communications, vol. 30, No. 5, Jun. 2012.
Simpson et al., Smart Transmitters and Receivers for Underwater Free-Space Optical Communication, 2012, IEEE, pp. 964-974.
Simpson et al., Smart Transmitters and Receivers for Underwater Free-Space Optical Communication, 2012, pp. 964-974, IEEE.
Simpson, J., Smart Transmitters and Receivers for Underwater Free-Space Optical Communication, IEEE Journal on Selected Areas in Communication, vol. 30, No. 5, Jun. 2012, 11 pages.
Simpson, Jim A. "Underwater Free-Space Optical Communication Using Smart Transmitters and Receivers," 2012.
Simpson, Jim A. "Underwater Free-Space Optical Communication Using Smart Transmitters and Receivers," v.2 2012.
Smart, Jeffrey H., "Underwater Optical Communications Systems: Part 1: Variability of Water Optical Parameters," IEEEE Military Communications Conference, 2005.
Song et al., Investigation of Geometrical Effects of Antireflective Subwavelength Grating Structures for Optical Device Applications, 2010, Springer Science Business Media, LLC, pp. 771-777.
U.S. Notice of Allowance dated Sep. 24, 2015 for U.S. Appl. No. 14/203,550.
U.S. Notice of Allowance on U.S. Appl. No. 13/843,942 dated Sep. 20, 2016.
U.S. Notice of Allowance on U.S. Appl. No. 14/203,550 dated Jun. 29, 2016.
U.S. Office Action dated Feb. 2, 2016 for U.S. Appl. No. 14/203,550.
U.S. Office Action on U.S. Appl. No. 14/203,550 dated Jun. 18, 2015.
U.S. Office Action on U.S. Appl. No. 13/843,942 dated Dec. 15, 2015.
U.S. Office Action on U.S. Appl. No. 13/843,942 dated Jun. 26, 2015.
U.S. Office Action on U.S. Appl. No. 13/843,942 dated Jun. 2, 2016.
U.S. Office Action on U.S. Appl. No. 14/203,550 dated Feb. 2, 2016.
U.S. Office Action on U.S. Appl. No. 15/081,627 dated Mar. 17, 2017.
U.S. Office Action on U.S. Appl. No. 15/334,486 dated Jan. 19, 2017.
WHOI Scientists and Engineers Partner with World-Renowned Companies to Market Revoluntionary New Instruments, Jul. 19, 2012.
Yoon, S., et al. "AURP: An AUV-Aided Underwater Routing Protocol for Underwater Acoustic Sensor Networks" Sensors 12.2 (2012), pp. 1827-1845.
Examination Report for application No. 14 798 429.8-1220 dated May 2, 2018.
Notice of Allowance on U.S. Appl. No. 15/081,627 dated May 7, 2018.
D. Hays et al., A New Method of Semi-permanent Reservoir Monitoring in Deep Water Using Ocean Bottom Nodes, pp. 1 - 9, Offshore Technology Conference, May 2-5, 2016, Houston, Texas, USA.
Farr, N. et al. "Optical Modem Technology for Seafloor Observatories" pp. 6.
Jawhar et al., An Efficient Framework for Autonomous Underwater Vehicle Extended Sensor Networks for Pipeline Monitoring, pp. 1-6, 2013, 2013 IEEE International Symposium on Robotic and Sensors Environments, Washington DC, USA.
Mexican First Office Action for application No. MX/a/2017/011038 dated Oct. 9 2018.
N.Farr, A. Bowen,J. et al. "An Integrated, Underwater Optical/Acoustic Communications System" 6 PAGES.
Notice of Allowance on U.S. Appl. No. 15/081,627 dated Aug. 8, 2018.
Notice of Allowance on U.S. Appl. No. 15/664,697 dated Dec. 18, 2018.
Office Action on U.S. Appl. No. 15/334,486 dated Oct. 22, 2018.
Office Action on U.S. Appl. No. 15/625,708 dated Sep. 4, 2018.
Simpson, Jim A. "Underwater Free-Space Optical Communication Using Smart Transmitters and Receivers" pp. 154.
Sta-rite Swimquip Brand Underwater Pool Lights and Niches for 12 and 120 Volt Light Fixtures Owners Manual, 2003.
Technip Metro logy Report, Field Report No. CG-TUKOOOI-FS-FR-269, Jun. 26 2016, http://eprints2.insa-strasbourg.fr/2564/2/2016_Wilhelm_Lau re_Annexes_PFE_Topographie.pdf.
U.S. Office Action on U.S. Appl. No. 15/664,697 dated Sep. 21, 2018.
Vasilescu et al., Data Collection Storage and Retrieval with an Underwater Sensor Network, pp. 154-165, SenSys'05, Nov. 2-4, 2005, San Diego, California, USA.

\* cited by examiner

HIGH-BANDWIDTH UNDERWATER DATA COMMUNICATION SYSTEM

CROSS-REFERENCE TO RELATED APPLICATIONS

This application claims the benefit of priority under 35 U.S.C. § 120 as a continuation of U.S. patent application Ser. No. 15/237,106, filed Aug. 15, 2016, which claims the benefit of priority under 35 U.S.C. § 120 as a continuation of U.S. patent application Ser. No. 14/203,550, filed Mar. 10, 2014, which claims the benefit of priority under 35 U.S.C. § 120 as a continuation in-part of U.S. patent application Ser. No. 13/843,942, filed Mar. 15, 2013, each of which are hereby incorporated by reference herein in their entirety.

FIELD OF THE INVENTION

The invention relates to the transmission of data between underwater entities, particular at high data rates.

BACKGROUND

This Background section is provided for informational purposes only, and should not be considered as an admission that any of the material contained in this section qualifies as prior art to the present application.

There is a need for conveying data between two separate underwater entities in applications including defense, oceanography, hydrocarbon development, etc. Conventional methods for conveying data between underwater entities employ either a tethered link using copper or fiber optics, or rely on acoustic transmission. According to the former approach, the underwater entities must be repositioned or replaced in situ, while the latter approach has a very low data rate (1 to 20 kilobits per second is typical) that is currently possible using acoustic transmission. An approach that uses light propagating freely in the ocean environment would provide much higher data rates and the possibility of conveniently exchanging data between arbitrary pairs of transmitting and receiving devices (transceivers).

Some attempts to implement data transmission between underwater entities using optical means have been frustrated by a lack of suitable light sources. The propagation of light through water is limited by the fundamental absorption properties of pure water, scattering of particulates such as plankton and inorganic particulates, and absorption by chlorophyll-containing phytoplankton and other organic materials. The components combine, in various combinations, to favor strongly the transmission of light in the blue-green region of the optical spectrum, approximately from 400 to 600 nm. The optical effect of the various combinations of the components admixed in water can be summarized as water types and range from the very purest natural waters, which favor deep blue propagation (nominally 450 nm), to waters which favor blue-green (nominally 490 nm) and green (nominally 530 nm) propagation. The minimum optical attenuation coefficients at the optimal wavelengths vary from about 0.02 m-1 for the very clearest natural waters, to more than 2 m-1 in the most turbid coastal or harbor waters.

Previous light sources in the blue-green wavelength range have included been bulky, inefficient, expensive and employed external modulators.

SUMMARY

At least one aspect is directed to a method of performing seismic exploration in an aqueous medium. In some embodiments, the method includes receiving sub-aqueous environmental data of a first ocean bottom seismometer (OBS) unit. The first OBS unit can be disposed in the aqueous medium. The method can include a data conversion module of the OBS unit converting the sub-aqueous environmental data into an optical signal having a first format. The first format can be configured for optical transmission in the aqueous medium. The method can include an optical transmitter of the OBS unit transmitting the optical signal in the first format through the aqueous medium. The method can include an optical receiver of at least one of a remotely operated vehicle (ROV) and an autonomous underwater vehicle (AUV) receiving the optical signal transmitted through the aqueous medium. The method can include the at least one of the ROV and the AUV converting the optical signal transmitted through the aqueous medium into a non-optical signal having a second format. The method can include the at least one of the ROV and the AUV transmitting the non-optical signal in the second format a marine vessel.

In some embodiments, the method can include converting the optical signal into the non-optical signal configured for wired transmission to a marine vessel. The method can include transmitting the non-optical signal to the marine vessel via a cable. In some embodiments, the optical receiver can include a first optical transceiver, and the optical transmitter can include a second optical transceiver. In some embodiments, the non-optical signal transmitted from the at least one of the ROV and the AUV to the marine vessel includes an electrical signal.

In some embodiments, the OBS unit is a first OBS unit, the optical signal is a first optical signal, and the geophone is a first geophone. In these embodiments, the method can include a second OBS unit transmitting a second optical signal to the first OBS unit through the aqueous medium. The second optical signal can be based on sub-aqueous environmental data received via the second OBS unit. The method can include the first OBS unit receiving the second optical signal for transmission to the at least one of the ROV and the AUV.

In some embodiments, the method includes at least one of the OBS unit, the ROV and the AUV determining a characteristic of the aqueous medium. The method can include adjusting a parameter associated with the optical signal based on the characteristic of the aqueous medium. In some embodiments, the characteristic comprises at least one of a turbidity metric, a water quality, a water current, and an opacity. In some embodiments, the parameter includes at least one of a data rate of the optical signal, an output intensity of the optical signal, a wavelength of the optical signal, and a gain of the receiver.

In some embodiments, the method includes initiating an optical link between the OBS unit and the at least one of the ROV and the AUV. The method can include the OBS unit transmitting a first optical signal to the at least one of the ROV and the AUV. The first optical signal can have a first data rate. The method can include determining that a bit error rate of the first signal satisfies a threshold. The method can include the OBS unit transmitting a second optical signal to the at least one of the ROV and the AUV. The second optical signal can have a second rate that is greater than the first rate, and the second rate can be transmitted responsive to determining that the bit error rate satisfies the threshold.

In some embodiments, the method includes initiating an optical link between the OBS unit and the at least one of the ROV and AUV. The method can include the OBS unit transmitting a first optical signal having a first data rate to the at least one of the ROV and the AUV. The method can include determining that a bit error rate of the first signal does not satisfy a threshold. The method can include selecting a second data rate that is less than the first data rate. The second data rate can be selected responsive to determining that the bit error rate does not satisfy the threshold. The method can include transmitting a second optical signal having the second data rate.

In some embodiments, the method includes initiating an optical link between the OBS unit and the at least one of the ROV and AUV. The method can include the OBS unit transmitting a first optical signal having a first data rate to the at least one of the ROV and the AUV. The method can include determining that a bit error rate of the first signal does not satisfy a threshold. The method can include adjusting an automatic gain control. The automatic gain control can be adjusted responsive to determining that the bit error rate does not satisfy the threshold, In some embodiments, the method can include the OBS unit transmitting the optical signal via at least one of a solid state light source, an InGaN based light source, a laser, and an LED. In some embodiments, the method can include the OBS unit transmitting data via the optical signal at a data rate of at least 300 Mbps. In some embodiments, the method can include the OBS unit transmitting the optical signal using a channel coding technique. The channel coding technique can include at least one of an on-off keyed format, 8b/10b encoding, pulse-position discrimination, Quadrature Phase Shift Keying (QPSK), and Quadrature Amplitude Discrimination. In some embodiments, the method can include the OBS unit transmitting the optical signal using a multi-carrier transmission discrimination technique based on Orthogonal Frequency Division Multiplexing (OFDM).

In some embodiments, the sub-aqueous environmental data includes data indicating at least one of seismic activity, dissolved solids in the aqueous medium, dissolved minerals in the aqueous medium, a state of the aqueous medium, oxygen concentration in the aqueous medium, salt concentration in the aqueous medium, plankton concentration in the aqueous medium, turbidity of the aqueous medium, and animal presence in the aqueous medium.

In some embodiments, the sub-aqueous environmental includes seismic data, and the method includes receiving the seismic data using a geophone of a first ocean bottom seismometer (OBS) unit disposed in the aqueous medium.

In some embodiments, the OBS unit is a first OBS unit, and the method includes receiving, by an optical receiver of a second OBS unit, from the first OBS unit, the optical signal. The method can include an optical transmitter of the second OBS unit transmitting the optical signal to at least one of the ROV and the AUV. In some embodiments, the sub-aqueous environmental includes seismic data, and the method includes receiving the seismic data using an accelerometer disposed in the OBS unit.

At least one aspect is directed to a system to perform seismic exploration in an aqueous medium. In some embodiments, the system can include a first ocean bottom seismometer (OBS) unit disposed in the aqueous medium. The first OBS unit can be configured to receive sub-aqueous environmental data. The system can include a first data conversion module of the OBS unit. The first data conversion module can be configured to convert the sub-aqueous environmental data into an optical signal having a first format. The first format can be configured for optical transmission in the aqueous medium. In some embodiments, the system can include an optical transmitter of the OBS unit.

The optical transmitter can be configured to transmit the optical signal in the first format through the aqueous medium. In some embodiments, the system can include an optical receiver of at least one of a remotely operated vehicle (ROV) and an autonomous underwater vehicle (AUV). The optical receiver can be configured to receive the optical signal transmitted through the aqueous medium. The system can include a second data conversion module of the at least one of the ROV and the AUV. The second data conversion module can be configured to convert the optical signal transmitted through the aqueous medium into a non-optical signal having a second format. The system can include a transmitter of the at least one of the ROV and the AUV. The transmitter can be configured to transmit the non-optical signal in the second format from the at least one of the ROV and the AUV to a marine vessel.

At least one aspect of the present disclosure is directed to a device for transmitting and receiving data optically through an aqueous medium. In some embodiments, the device includes an optical transmitter. The device can also include an optical receiver. The transmitter and receiver can operate using light with wavelengths in the range of 400 nm-600 nm.

In one embodiment, the optical transmitter and optical receiver of the device are enclosed in a waterproof container. The optical container can include one or more optical windows. Light can be transmitted through the one or more optical windows through the waterproof container and into or out of the aqueous medium.

In one embodiment, the optical transmitter includes at least one solid state light source.

In one embodiment, the light source is an InGaN based light source.

In one embodiment, the light source includes an LED.

In one embodiment, the light source includes a laser.

In one embodiment, the device is configured to transmit data at a rate of about 10 Mbps or greater.

In one embodiment, the device is configured to transmit data at a rate of about 100 Mbps or greater.

In one embodiment, the device includes a controller configured to modulate the output of the light source. The controller can modulate the output of the light source by varying a drive current to the source.

In one embodiment, the optical receiver includes a photodiode.

In one embodiment, the optical receiver includes at least one from the list consisting of: a silicon photodiode, silicon PIN photodiode, and avalanche photodiode, and a hybrid photodiode.

In one embodiment, the optical receiver includes a photomultiplier tube.

In one embodiment, the optical receiver includes a microchannel plate configured to detect particles such as photons.

In one embodiment, the photomultiplier tube includes a plurality of gain stages. An output can be extracted from a gain stage prior to a final gain stage.

In one embodiment, the optical receiver is configured to use a measurement of the optical signal strength to control the gain of an amplifier following the optical detector.

In one embodiment, the optical receiver is configured to use a measurement of the optical signal strength to control a gain of the optical detector.

In one embodiment, the device includes at least one controller operatively coupled to one or both of the transmitter and receiver. The controller can be configured to implement a channel coding technique during transmission.

In one embodiment, the device includes at least one controller operatively coupled to one or both of the transmitter and receiver. The controller can be configured to dynamically adjust one or more transmission parameters. The controller can dynamically adjust the transmission parameters responsive to one or more detected transmission conditions.

In one embodiment, dynamically adjusting one or more transmission parameters includes controlling the gain of one or more amplifier elements in the device.

In one embodiment, the device includes at least one controller operatively coupled to one or both of the transmitter and receiver. The controller can be configured to implement multi-carrier transmission discrimination techniques.

In one embodiment, the discrimination technique can include optically based Orthogonal Frequency Division Multiplexing (OFDM).

In one embodiment, the transceiver is configured to enter a power up state in response to the detected presence of another data transmission device.

In one embodiment, the device includes a controller configured to align a local transceiver with a remote transceiver. The controller can align the local transceiver with the remote transceiver based on a signal from the one or more optical detectors that can sense the relative angle of the remote transceiver.

In one embodiment, the device includes a controller configured to align a local transceiver with a remote transceiver based on a signal from one or more sensors used to detect the relative position of the remote transceiver.

In one embodiment, the controller is configured to control a platform for the device based at least in part on the detected position information.

In one embodiment, the device includes a controller configured to control a plurality of transmitting sources to direct light to the remote transceiver. The controller can control the plurality of transmitting sources based on a signal from one or more optical detectors used to sense the relative angle of the remote transceiver.

In one embodiment, the device includes a controller configured to select an anode in a multiple-anode photomultiplier tube and align a local receiver's angular field of view with the remote transceiver. The controller can select the anode and align the local receiver's angular field view based on a signal from one or more optical detectors that are used to sense the relative angle of a remote transceiver.

In one embodiment, the device includes a controller configured to provide guidance commands to a platform on which the device is mounted. The one or more optical detectors can be used to sense the relative angle of a remote transceiver.

In one embodiment, the device is incorporated in an all-optical system for transmission of seismic data.

In one embodiment, the one or more diffractive optical elements are used to collect an optical transmission beam.

In one embodiment, the one or more diffractive optical elements are used to steer an optical transmission beam.

In one embodiment, one or more diffractive optical elements are used to shape an optical transmission beam.

In one embodiment, the device is mounted on or in at least one from the list consisting of: a remotely operated vehicle, an autonomously operated vehicle, a submarine vessel, and an ocean bottom seismic node.

In one embodiment, the device includes an acoustic communication device.

At least one aspect is directed to a method that includes optically transmitting data through an aqueous medium using light with wavelengths in the range of 400 nm-600 nm.

In one embodiment, the method includes generating the light using at least one solid state light source.

In one embodiment of the method, the light source includes an LED.

In one embodiment, the light source includes a laser.

In one embodiment, the step of optically transmitting data includes transmitting data at a rate of at least about 10 Mbps.

In one embodiment, the step of optically transmitting data includes transmitting data at a rate of at least 100 Mbps.

In one embodiment, the step of optically transmitting data includes using one or more channel coding techniques.

In one embodiment, the step of optically transmitting data includes dynamically adjusting one or more transmission parameters. The transmission parameters can be dynamically adjusted in response to one or more detected transmission conditions.

In one embodiment, the step of optically transmitting data includes implementing a multi-carrier transmission discrimination technique.

In one embodiment, the discrimination technique includes optically based Orthogonal Frequency Division Multiplexing (OFDM).

In some embodiments, an output optical transmitted signal can be transmitted through a fiber optic to a window. In some embodiments, a plurality of fiber optics can be bundled together and tapered at one end (e.g., at 1 mm diameter at one and 1 cm at a second end) such that an optical signal can be transmitted through the window.

DETAILED DESCRIPTION

Figure 1:
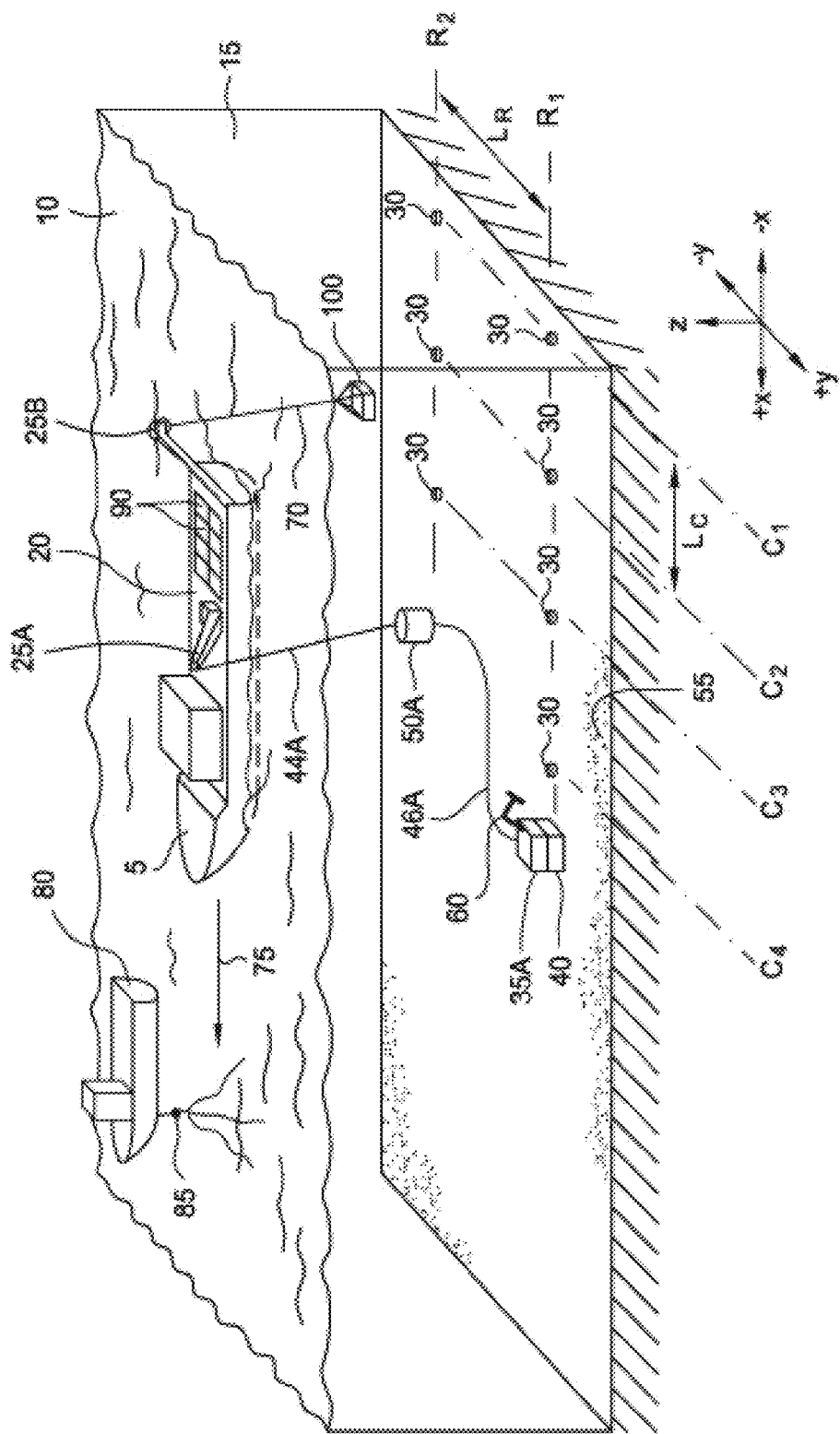
FIG. 1 is an isometric schematic view of one embodiment of a seismic operation in deep water.

Applicants have recognized that optical data transceivers may be provided that operate in an aqueous medium, such as a marine environment in which seismic exploration is performed. In some embodiments, the transceivers operate with high data transfer rates, e.g., greater than about 1 megabit per second (Mbps), about 10 Mbps, about 100 Mbps, about 300 MBps, or more (e.g., up to or exceeding about 1 Gbps). In some embodiments, systems and methods can use a variable, asymmetric link where a first optical signal has a first data rate and a second optical signal has a second data rate different from the first optical signal.

In some embodiments, the devices use light sources, e.g., lasers light sources or light emitting diode ("LED") sources, with outputs in the blue-green region of the spectrum, e.g., with wavelengths in the range of 400-600 nm or any subrange thereof.

For example, in some embodiments, solid-state light emitters, e.g., based upon the Indium-Gallium-Nitride (InGaN) semiconductor materials now provide a family of light sources in the blue-green spectral region that are efficient, compact, long-lived, and can be directly modulated (their optical output power controlled by the amount of electrical current flow in the device). Such devices may operate at wavelengths throughout the blue-green region. Because these devices can be directly modulated, e.g., by modulating a drive current, they can be arranged in arrays for increased output power or for transmission into other spatial directions such as between platforms with relative movement.

In some embodiments, the receiver portion of the transceiver device includes one or more optical detectors that are sensitive in the blue-green spectral region that may be compact and reliable. Examples include detectors using semiconductor junctions such as PN junctions or PIN junctions (e.g., silicon PIN photodiodes or avalanche photodiodes). For example, in some embodiments, avalanche photodiodes may be used that, with the proper electrical bias voltage applied, exhibit electronic gain, which can be useful in certain implementations. Photomultiplier tubes may also be used in the blue-green, and have the advantage, like avalanche photodiodes, of voltage-dependent electronic gain, as well as fast temporal response even with large collecting areas.

In some embodiments, the optical detector's active or photosensitive area places simultaneous constraints on the collecting area of a receiver lens and the angular field over which light intercepted by the receiver lens actually lands on the detector (the angular field of view). Under some applications, particularly where one or another underwater platform is maneuvering, the angular field of view possible with temporally optimal detectors will be too small to maintain a communication connection. Also, it may be useful to reduce the angular spread of the transmitter beam in order to increase the intercepted power on a remote receiver. In this case it may be advantageous to mount the transmitter and receiver on controllable mounts (e.g., gimbals), or to provide a mechanism (e.g., an electrical or electromechanical mechanism) for the transmitter output beam and/or the receiver field of view to follow a remote transmitter and receiver. Guidance commands for the motion of the transmitter and receiver can be generated using, e.g., a system of optical detectors or a multi-element detector with appropriate signal processing to interpret varying light levels from the remote transmitter and guide the direction of the transmitter beam and the receiver field of view.

FIG. 1 is an isometric schematic view of one embodiment of a seismic operation in deep water facilitated by a first marine vessel 5. The first vessel 5 is positioned on a surface 10 of a water column 15 and includes a deck 20 which supports operational equipment. At least a portion of the deck 20 includes space for a plurality of sensor device racks 90 where seismic sensor devices are stored. The sensor device racks 90 may also include data retrieval devices and/or sensor recharging devices.

The deck 20 also includes one or more cranes 25A, 25B attached thereto to facilitate transfer of at least a portion of the operational equipment, such as an autonomous underwater vehicle (AUV), autonomously operated vehicle (AOV), an ROV and/or seismic sensor devices, from the deck 20 to the water column 15. For example, a crane 25A coupled to the deck 20 is configured to lower and raise an ROV 35A, which transfers and positions one or more sensor devices 30 (e.g., OBS units) on a seabed 55. The ROV 35A is coupled to the first vessel 5 by a tether 46A and an umbilical cable 44A that provides power, communications, and control to the ROV 35A. A tether management system (TMS) 50A is also coupled between the umbilical cable 44A and the tether 46A. Generally, the TMS 50A may be utilized as an intermediary, subsurface platform from which to operate the ROV 35A. For most ROV 35A operations at or near the seabed 55, the TMS 50A can be positioned approximately 50 feet above seabed 55 and can pay out tether 46A as needed for ROV 35A to move freely above seabed 55 in order to position and transfer seismic sensor devices 30 thereon.

A crane 25B is coupled to a stern of the first vessel 5, or other locations on the first vessel 5. Each of the cranes 25A, 25B may be any lifting device and/or launch and recovery system (LARS) adapted to operate in a marine environment. In this embodiment, the crane 25B is coupled to a seismic sensor transfer device 100 by a cable 70. The transfer device 100 may be a drone, a skid structure, a basket, or any device capable of housing one or more sensor devices 30 therein. The transfer device 100 may be a structure configured as a magazine adapted to house and transport one or more sensor devices 30. In one embodiment, the transfer device 100 is configured as a sensor device storage rack for transfer of sensor devices 30 from the first vessel 5 to the ROV 35A, and from the ROV 35A to the first vessel 5. The transfer device 100 may include an on-board power supply, a motor or gearbox, and/or a propulsion system (all not shown). Alternatively, the transfer device 100 may not include any integral power devices and/or not require any external or internal power source. If needed, the cable 70 may provide power and/or control to the transfer device 100. Alternatively, the cable 70 may be an umbilical, a tether, a cord, a wire, a rope, and the like, that is configured solely for support of the transfer device 100.

The ROV 35A includes a seismic sensor device storage compartment 40 that is configured to store one or more seismic sensor devices 30 therein for a deployment and/or retrieval operation. The storage compartment 40 may be a magazine, a rack, or a container configured to store the seismic sensor devices. The storage compartment 40 may also include a movable platform having the seismic sensor devices thereon, such as a carousel or linear platform configured to support and move the seismic sensor devices 30 therein. In one embodiment, the seismic sensor devices 30 may be deployed on the seabed 55 and retrieved therefrom by operation of the movable platform. In this embodiment, the ROV 35A may be positioned at a predetermined location above or on the seabed 55 and seismic sensor devices 30 are rolled, conveyed, or otherwise moved out of the storage compartment 40 at the predetermined location. In another embodiment, the seismic sensor devices 30 may be deployed and retrieved from the storage compartment 40 by a robotic device 60, such as a robotic arm, an end effector or a manipulator, disposed on the ROV 35A.

For example, in a deployment operation, a first plurality of seismic sensor devices, comprising one or more sensor devices 30, may be loaded into the storage compartment 40 while on the first vessel 5 in a pre-loading operation. The ROV 35A, having the storage compartment coupled thereto, is then lowered to a subsurface position in the water column 15. The ROV 35A utilizes commands from personnel on the first vessel 5 to operate along a course to transfer the first plurality of seismic sensor devices 30 from the storage compartment 40 and deploy the individual sensor devices 30 at selected locations on the seabed 55. Once the storage compartment 40 is depleted of the first plurality of seismic sensor devices 30, the transfer device 100 is used to ferry a second plurality of seismic sensor devices 30 as a payload from first vessel 5 to the ROV 35A.

The transfer device 100 is preloaded with a second plurality of seismic sensor devices 30 while on or adjacent the first vessel 5. When a suitable number of seismic sensor devices 30 are loaded onto the transfer device 100, the transfer device 100 may be lowered by crane 25B to a selected depth in the water column 15. The ROV 35A and transfer device 100 are mated at a subsurface location to allow transfer of the second plurality of seismic sensor devices 30 from the transfer device 100 to the storage compartment 40. When the transfer device 100 and ROV 35A are mated, the second plurality of seismic sensor devices 30 contained in the transfer device 100 are transferred to the storage compartment 40 of the ROV 35A. Once the storage compartment 40 is reloaded, the ROV 35A and transfer device 100 are detached or unmated and seismic sensor device placement by ROV 35A may resume. In one embodiment, reloading of the storage compartment 40 is provided while the first vessel 5 is in motion. If the transfer device 100 is empty after transfer of the second plurality of seismic sensor devices 30, the transfer device 100 may be raised by the crane 25B to the vessel 5 where a reloading operation replenishes the transfer device 100 with a third plurality of seismic sensor devices 30. The transfer device 100 may then be lowered to a selected depth when the storage compartment 40 needs to be reloaded. This process may repeat as needed until a desired number of seismic sensor devices 30 have been deployed.

Using the transfer device 100 to reload the ROV 35A at a subsurface location reduces the time required to place the seismic sensor devices 30 on the seabed 55, or "planting" time, as the ROV 35A is not raised and lowered to the surface 10 for seismic sensor device reloading. Further, mechanical stresses placed on equipment utilized to lift and lower the ROV 35A are minimized as the ROV 35A may be operated below the surface 10 for longer periods. The reduced lifting and lowering of the ROV 35A may be particularly advantageous in foul weather and/or rough sea conditions. Thus, the lifetime of equipment may be enhanced as the ROV 35A and related equipment are not raised above surface 10, which may cause the ROV 35A and related equipment to be damaged, or pose a risk of injury to the vessel personnel.

Likewise, in a retrieval operation, the ROV 35A utilizes commands from personnel on the first vessel 5 to retrieve each seismic sensor device 30 that was previously placed on seabed 55. The retrieved seismic sensor devices 30 are placed into the storage compartment 40 of the ROV 35A. In one embodiment, the ROV 35A may be sequentially positioned adjacent each seismic sensor device 30 on the seabed 55 and the seismic sensor devices 30 are rolled, conveyed, or otherwise moved from the seabed 55 to the storage compartment 40. In another embodiment, the seismic sensor devices 30 may be retrieved from the seabed 55 by a robotic device 60 disposed on the ROV 35A.

Once the storage compartment 40 is full or contains a pre-determined number of seismic sensor devices 30, the transfer device 100 is lowered to a position below the surface 10 and mated with the ROV 35A. The transfer device 100 may be lowered by crane 25B to a selected depth in the water column 15, and the ROV 35A and transfer device 100 are mated at a subsurface location. Once mated, the retrieved seismic sensor devices 30 contained in the storage compartment 40 are transferred to the transfer device 100. Once the storage compartment 40 is depleted of retrieved sensor devices, the ROV 35A and transfer device 100 are detached and sensor device retrieval by ROV 35A may resume. Thus, the transfer device 100 can ferry the retrieved seismic sensor devices 30 as a payload to the first vessel 5, allowing the ROV 35A to continue collection of the seismic sensor devices 30 from the seabed 55. In this manner, sensor device retrieval time is significantly reduced as the ROV 35A is not raised and lowered for sensor device unloading. Further, mechanical stresses placed on equipment related to the ROV 35A are minimized as the ROV 35A may be subsurface for longer periods.

In this embodiment, the first vessel 5 may travel in a first direction 75, such as in the +X direction, which may be a compass heading or other linear or predetermined direction. The first direction 75 may also account for and/or include drift caused by wave action, current(s) and/or wind speed and direction. In one embodiment, the plurality of seismic sensor devices 30 are placed on the seabed 55 in selected locations, such as a plurality of rows $R_n$ in the X direction ($R_1$ and $R_2$ are shown) and/or columns $C_n$ in the Y direction ($C_1$-$C_3$ are shown), wherein n equals an integer. In one embodiment, the rows $R_n$ and columns $C_n$ define a grid or array, wherein each row $R_n$ comprises a receiver line in the width of a sensor array (X direction) and/or each column $C_n$ comprises a receiver line in a length of the sensor array (Y direction), The distance between adjacent sensor devices 30 in the rows is shown as distance $L_R$ and the distance between adjacent sensor devices 30 in the columns is shown as distance $L_C$. While a substantially square pattern is shown, other patterns may be formed on the seabed 55. Other patterns include non-linear receiver lines and/or non-square patterns. The pattern(s) may be pre-determined or result from other factors, such as topography of the seabed 55. In one embodiment, the distances $L_R$ and $L_C$ may be substantially equal and may include dimensions between about 60 meters to about 400 meters, or greater. The distance between adjacent seismic sensor devices 30 may be predetermined and/or result from topography of the seabed 55 as described above.

The first vessel 5 is operated at a speed, such as an allowable or safe speed for operation of the first vessel 5 and any equipment being towed by the first vessel 5. The speed may take into account any weather conditions, such as wind speed and wave action, as well as currents in the water column 15. The speed of the vessel may also be determined by any operations equipment that is suspended by, attached to, or otherwise being towed by the first vessel 5. For example, the speed is typically limited by the drag coefficients of components of the ROV 35A, such as the TMS 50A and umbilical cable 44A, as well as any weather conditions and/or currents in the water column 15. As the components of the ROV 35A are subject to drag that is dependent on the depth of the components in the water column 15, the first vessel speed may operate in a range of less than about 1 knot. In this embodiment, wherein two receiver lines (rows $R_1$ and $R_2$) are being laid, the first vessel includes a first speed of between about 0.2 knots and about 0.6 knots. In other embodiments, the first speed includes an average speed of between about 0.25 knots, which includes intermittent speeds of less than 0.25 knots and speeds greater than about 1 knot, depending on weather conditions, such as wave action, wind speeds, and/or currents in the water column 15.

During a seismic survey, one receiver line, such as row $R_1$ may be deployed. When the single receiver line is completed a second vessel 80 is used to provide a source signal. The second vessel 80 is provided with a source device 85, which may be a device capable of producing acoustical signals or vibrational signals suitable for obtaining the survey data. The source signal propagates to the seabed 55 and a portion of the signal is reflected back to the seismic sensor devices 30. The second vessel 80 may be required to make multiple passes, for example at least four passes, per a single receiver line (row $R_1$ in this example). During the time the second vessel 80 is making the passes, the first vessel 5 continues deployment of a second receiver line. However, the time involved in making the passes by the second vessel 80 is much shorter than the deployment time of the second receiver line. This causes a lag time in the seismic survey as the second vessel 80 sits idle while the first vessel 5 is completing the second receiver line.

In this embodiment, the first vessel 5 utilizes one ROV 35A to lay sensor devices to form a first set of two receiver lines (rows $R_1$ and $R_2$) in any number of columns, which may produce a length of each receiver line of up to and including several miles. In one embodiment, the two receiver lines (rows $R_1$ and $R_2$) are substantially parallel. When a single directional pass of the first vessel 5 is completed and the first set (rows $R_1$, $R_2$) of seismic sensor devices 30 are laid to a predetermined length, the second vessel 80, provided with the source device 85, is utilized to provide the source signal. The second vessel 80 is typically required to make eight or more passes along the two receiver lines to complete the seismic survey of the two rows $R_1$ and $R_2$.

While the second vessel 80 is shooting along the two rows $R_1$ and $R_2$, the first vessel 5 may turn 180 degrees and travel in the –X direction in order to lay seismic sensor devices 30 in another two rows adjacent the rows $R_1$ and $R_2$, thereby forming a second set of two receiver lines. The second vessel 80 may then make another series of passes along the second set of receiver lines while the first vessel 5 turns 180 degrees to travel in the +X direction to lay another set of receiver lines. The process may repeat until a specified area of the seabed 55 has been surveyed. Thus, the idle time of the second vessel 80 is minimized as the deployment time for laying receiver lines is cut approximately in half by deploying two rows in one pass of the vessel 5.

Although only two rows $R_1$ and $R_2$ are shown, the sensor device 30 layout is not limited to this configuration as the ROV 35A may be adapted to layout more than two rows of sensor devices in a single directional tow. For example, the ROV 35A may be controlled to lay out between three and six rows of sensor devices 30, or an even greater number of rows in a single directional tow. The width of a "one pass" run of the first vessel 5 to layout the width of the sensor array is typically limited by the length of the tether 46A and/or the spacing (distance $L_R$) between sensor devices 30.

Figure 2:
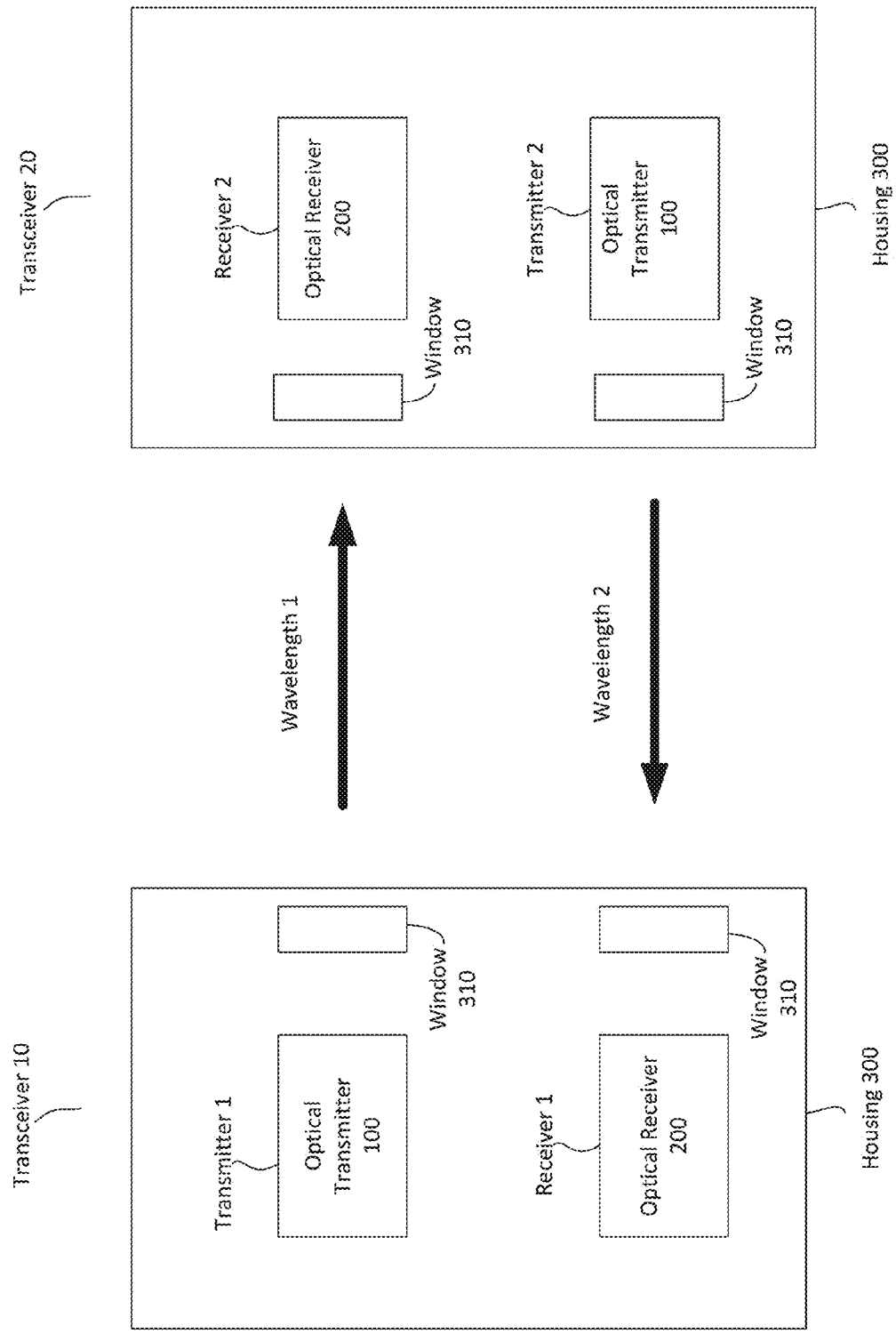
FIG. 2 is a block diagram showing operation of an exemplary pair of transceivers in communication with each other.

Referring to FIG. 2, an optical communication system that transmit data through an aqueous medium includes a first optical transceiver 10 and a second optical transceiver 20. Each optical transceiver includes an optical transmitter 100 and an optical receiver 200. As shown, the optical transmitter 100 and an optical receiver 200 of transceiver 10 are packaged together in a housing 300 to provide bi-directional data transmission with a similarly packaged optical transceiver 20.

Each of the transceivers may be mounted on any suitable platform including an underwater vehicle (e.g., subsea equipment, a submarine, remotely operated vehicle, or autonomously operated vehicle), an underwater device (e.g., an ocean bottom seismic node, such as the types available from FairfieldNodal, Inc. of Sugarland, Tex.), an underwater structure (e.g., an oil drilling or pumping platform), or any other suitable object.

A transmitter and receiver packaged together are referred to as a transceiver. Although the embodiments shown focus on transceiver packages, it is to be understood that in various embodiments, the transmitter and receiver may be separately packaged. In some embodiments, a single transmitter in a single receiver may be used for uni-directional communication.

As shown in FIG. 2, simultaneous bi-directional data transmission may be accomplished by the use of spectrally separated wavelengths, so that the transmitter 1 of transceiver 10 may transmit a wavelength 1 (for example, a blue wavelength or band of wavelengths, such as might be emitted by an InGaN LED) and the transmitter 2 of transceiver 20 transmits a wavelength 2 for example, a blue-green or green wavelength or band of wavelengths). The receiver 2 of transceiver 20 can receive the wavelength 1 of transmitter 1 and reject the wavelength 2 of transmitter 2 and all or as many as possible wavelengths outside the band of wavelength 1 using optical filters. Other data transmission schemes may be employed as well. For example, instead of separating the upstream and downstream signals by wavelength, they may instead be transmitted using time-division multiplexing or by polarization. Similarly, code-division multiplexing and other data transmission schemes may be used.

Various embodiments include the capacity to incorporate multi-carrier transmission discrimination techniques such as optically based Orthogonal Frequency Division Multiplexing (OFDM). Many closely spaced subcarriers are utilized to increase the overall transmission rate. The optical data can also be transmitted using coherent OFDM, CO-OFDM, protocols using single carrier or multicarrier transmission schemes. In some embodiments, discrimination or discrimination techniques can refer to optical discrimination techniques.

Similarly receiver of transceiver 1 may be configured to receive wavelength 2 of transmitter 2 and reject the wavelength of transmitter 1 and all or as many as possible wavelengths outside the band of wavelength 2.

Figure 3:
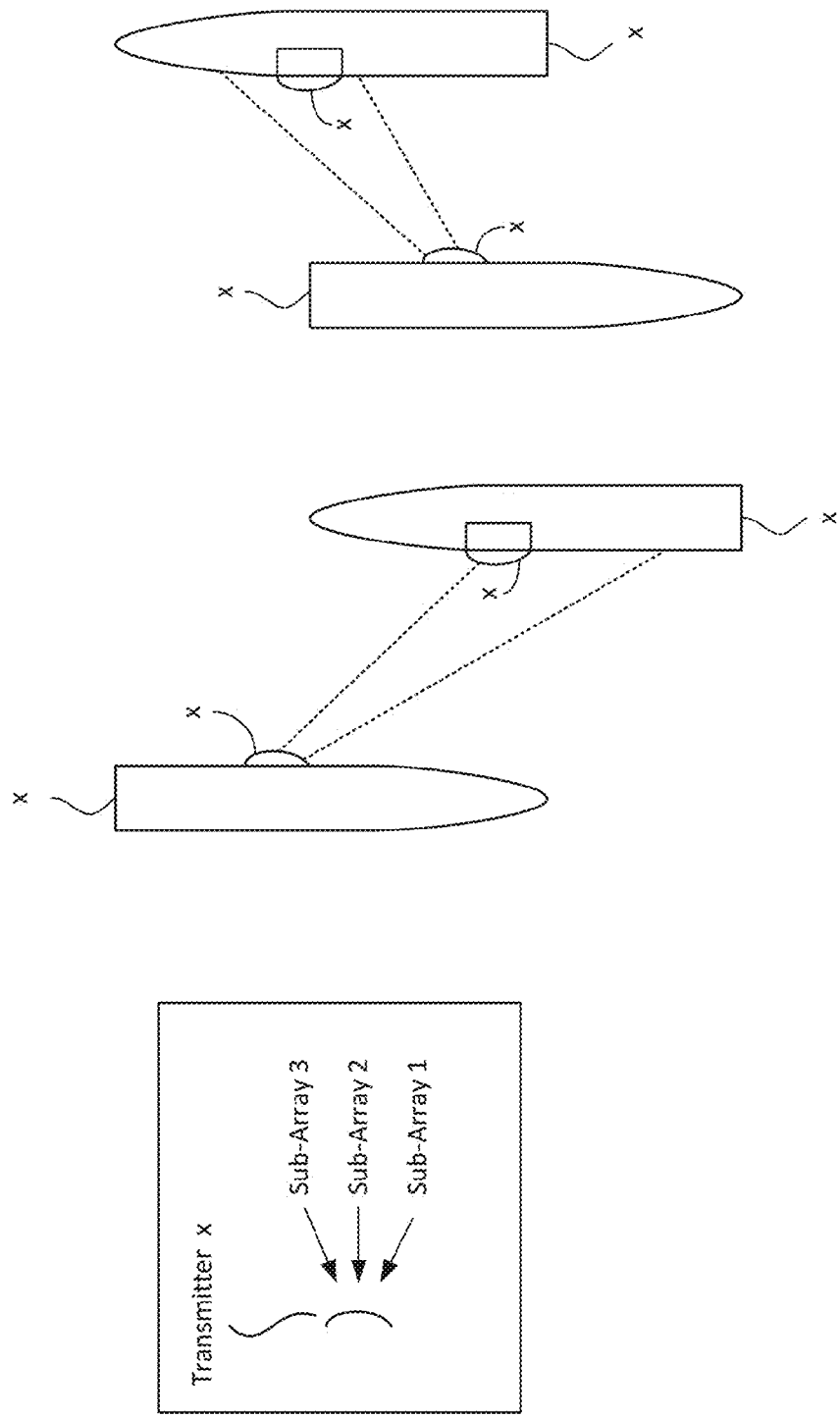
FIG. 3 is an illustration of exemplary pairs of transceivers.

Another embodiment, shown in FIG. 3, provides for bidirectional transmission by spatial separation of the respective transmitters and receivers. Here the transmitter 1 of transceiver 1 is aligned (e.g., closely aligned) with receiver 2 of transceiver 2, and the transmitter 2 of transceiver 2 is aligned (e.g., closely aligned) with the receiver 1 of transceiver 1, so as to prevent light emitted by transmitter 1 but scattered by the intervening aqueous medium from entering receiver 1, and similarly the light from transmitter 2 but scattered by the intervening aqueous medium is unable to enter receiver 2. In some embodiments, the optical transceivers 10 and 20 can include one or more filters configured to prevent, limit, block, or otherwise filter light coming from one or more directions (e.g., to limit off-axis visibility). In a non-limiting example, the one or more filters may include a honeycomb filter or a directionally selective optical plate. For example, in order to discriminate unwanted photon sources, a direction sorting device such as a light control film, window blind louver type or element or the like may be used.

Various embodiments may include one or more mechanisms to direct the output light from a transmitter in the direction of a receiver and/or to cause the field of view of a receiver to track the output of a transmitter. In addition to mechanical scanning of the transmitter and receiver to change the pointing direction, electronic systems may also be used. An electronic system capable of scanning the transmitter direction may arrange a plurality of individual light sources (e.g. LEDs or lasers), or a plurality of arrays of light sources, pointing in different directions so that the device or array pointing in the direction of interest can be used to transmit the data, as shown in FIG. 2. In this way the power consumption of the transceiver can be significantly reduced compared to a system that transmits power into a larger angular field of view.

Figure 4:
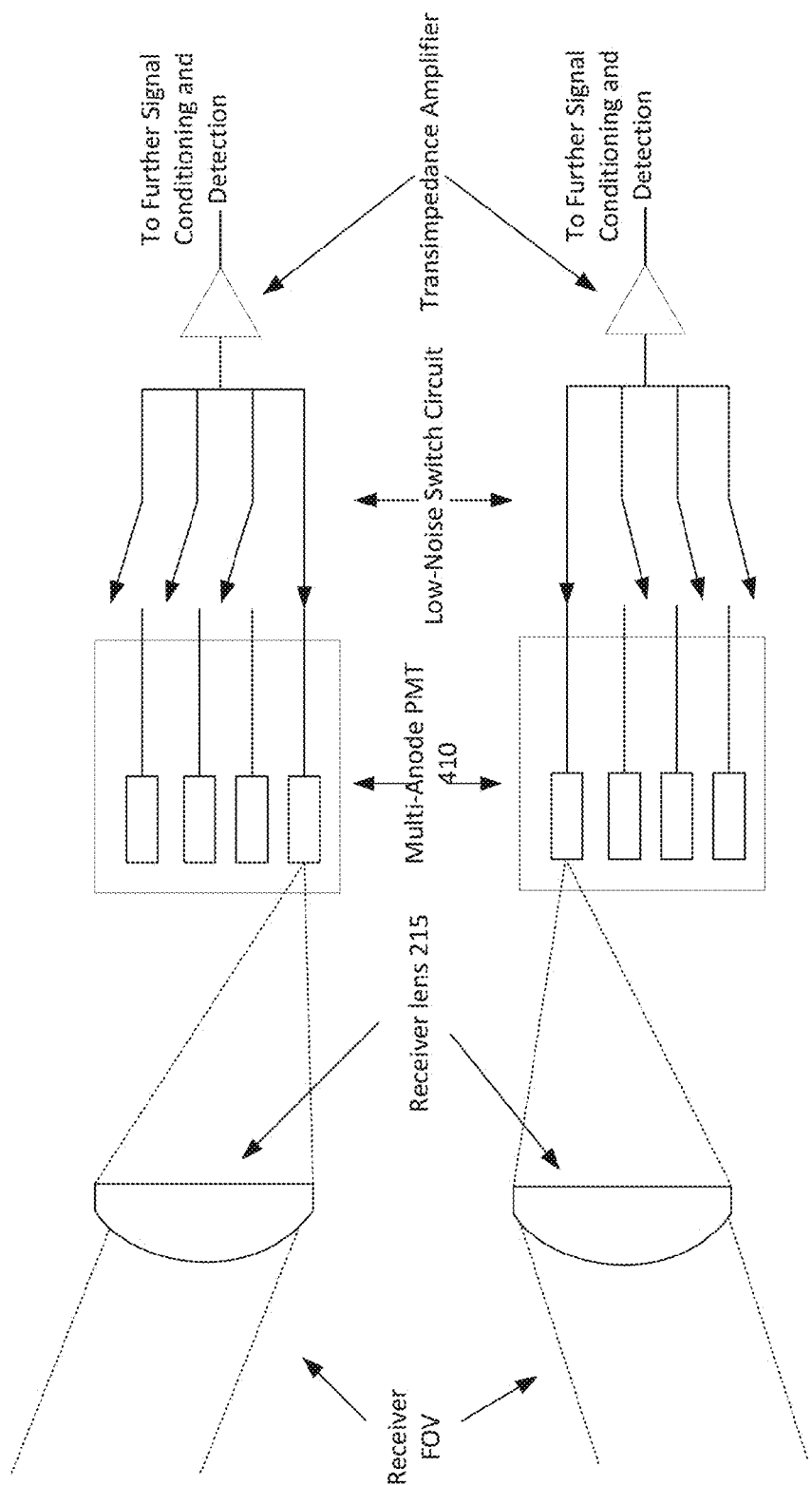
FIG. 4 is an illustration of receiver lenses and corresponding circuitry.

For example, FIG. 4 shows an electronic mechanism for scanning the receiver field of view using a multiple-anode photomultiplier tube 410, in which separate gain-producing dynode arrays and anodes are provided in a one- or two-dimensional arrangement such that light striking a spatial location on the photocathode produces an electrical signal at the anode corresponding to the photocathode spatial location. By placing the multiple-anode photomultiplier tube 410 at the focus of a lens 215 the angular position of the remote transmitter beam is converted into a spatial location on the photocathode. This receiver can serve a dual purpose; sensing the location of the remote transmitter for guidance; and by selecting only the anode corresponding to the photocathode location where the transmitter signal is detected a specific field of view can be obtained, as in FIG. 2, thereby rejecting interfering light sources.

Figure 5:
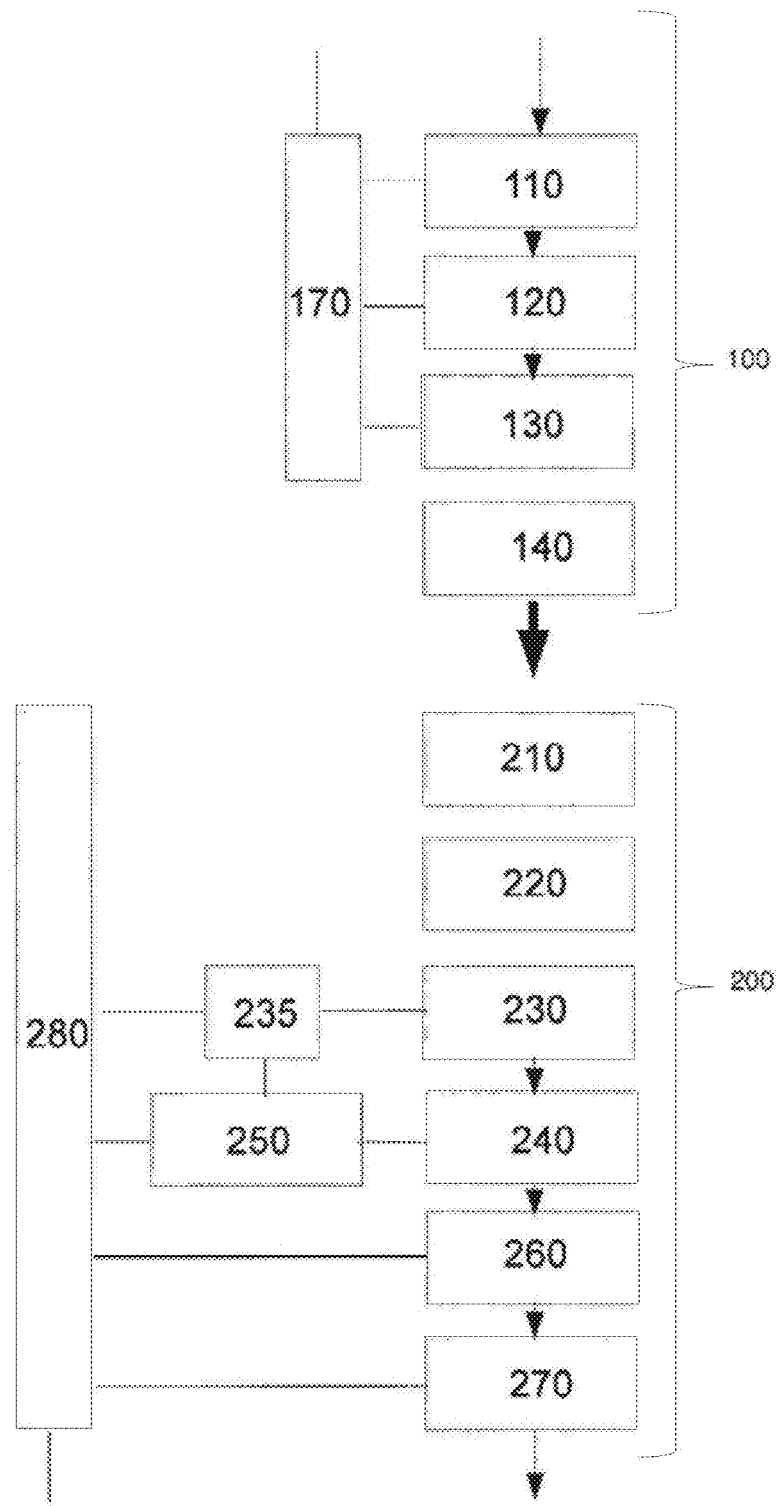
FIGS. 5-9 are block diagrams of exemplary embodiments of transceivers.

The components of an exemplary optical transceiver are now described with reference to FIG. 5. The transmitter 100 comprises a series of electronic components used to convert an incoming data signal into an outgoing optical signal that can be transmitted through the aqueous medium. A data signal is conducted to a data conversion module 110, which converts the incoming data for transmission via a non-optical domain, typically conveyed using either a conducting cable or a fiber-optic cable, into an on-off keyed format, such as 8b/10b encoding or pulse-position discrimination, which is appropriate for use by the transmitter. This module may typically also provide the functions of ascertaining whether a data connection is present on the cable side, and in turn provide a signaling format that the transmitter can transmit to a remote receiver so as to alert the remote transceiver as to its presence. The output of the data conversion module 110 is conveyed to a transmitter drive module 120, which receives the output of the data conversion module 110 and by use of amplifiers and other electronic components converts the output of the data conversion module 110 into a drive signal for the light source 130, either singly or in a plurality (e.g., an array), such that the optical output of the light source 130 varies between a lower optical power state (e.g., with little or no optical output) and a higher optical power state.

The electronic circuits of the transmitter drive module 120 may be designed so as to maintain as much fidelity as possible between the temporal characteristics (pulse width, risetime and falltime) of the electronic output waveform of the data conversion module 110 and the optical output waveform of the light source 130. This may require a combination of electronic feedback within the amplifier circuits, temperature compensation to correct for temperature-induced changes in the optical output of the light source 130 for a given electrical current conveyed from the transmitter drive module 120, or optical feedback from the light source 130 into circuits associated with the transmitter drive module 120 such that the optical waveform exhibits maximum fidelity to the input electrical waveform.

As noted above, the light source may be, for example, an LED source or a laser source, such as an InGaN based LED or current driven solid state laser such as an InGaN laser. The choice of whether an LED or laser is used will depend largely on the data bandwidth required. In some embodiments, it may be difficult to achieve to achieve data bandwidths of much greater than 10 or 20 Mbps using LEDs due to carrier-lifetime effects in the PN junction leading to long temporal decays of the optical output.

In contrast, laser sources may operate with a significantly shorter temporal pulse width. In some embodiments this is because when the drive current to the laser drops below a threshold level, lasing ceases, and the output intensity of the laser rapidly decreases. Similarly, as the drive current increases across the lasing threshold, the output intensity of the laser may rapidly increase. Accordingly, the modulated laser output may reproduce even a rapidly modulated drive signal with very high fidelity. Accordingly, in some embodiments, a data rate transmission rate of greater than 10 Mbps, 50 Mbps, 75 Mbps, 100 Mbps, 200 Mbps, 300 Mbps, 400 Mbps, 500 Mbps, 600 Mbps, 1000 Mbps or more may be provided.

The optical output of the light source may be modified in angular extent by use of an optical element 140. The optical element 140 may be, for example, a transparent epoxy lens integral to an LED or diode laser in an industry-standard package, or, particularly in the case of a laser in lieu of an LED, this external element may be a lens or other refractive, reflective, or diffractive element as required to shape the transmitter beam into the desired angular field.

A power supply 170 is provided to condition input power from the platform hosting the transmitter 100 and provide the required voltages and currents to power the various electronic modules of the transmitter 100. This power supply 170 may typically be a high-efficiency, low-noise switching supply, with one or more outputs.

The receiver 200 of the optical transceiver will generally comprise an optical element 210 which collects incoming light and directs it to the photosensitive area of an optical detector 230. The optical element 210 may be a spherical or aspherical lens, or another reflective, refractive, or diffractive optical element (or grouping of elements) selected so as to match the desired angular field and collecting area with the photosensitive area of the detector. In one embodiment a field lens 215 may be added following the optical element 210 in order to illuminate the surface of the optical detector 230 more uniformly.

An optical filter 220 (or any other suitable wavelength selective elements) will either precede the optical element 210 (be placed on the side towards the remote transmitter 100) or follow the optical element 210 but precede the optical detector 230. The purpose of the optical filter is to as completely as possible transmit only the optical wavelength or wavelengths corresponding to those emitted by the remote transmitter 100 and to reject as completely as possible the wavelength or wavelengths emitted by an adjacent transmitter, as well as ambient sunlight and other extraneous light. The optical filter 220 may include, for example, a color (absorbing) glass filter, a color (absorbing) plastic filter, or an interference (reflecting) filter or wavelength diffractive element, as appropriate to the required optical bandwidth, rejection and angular acceptance. In some embodiments, the optical filter 220 may include a special filter, a general filter, a custom designed filter or other type of filter configured to facilitate optical bandwidth rejection).

The optical detector 230 converts the light collected by optical element 210 and transmitted by optical filter 220 into an electrical signal for further processing. The optical detector is followed by an amplifier module 240. In one embodiment the optical detector 230 may be a semiconductor detector such as a silicon PIN photodiode. In this embodiment the amplifier module 240 comprises a preamplifier and an automatic gain control amplifier to amplify the electrical output of the photodiode to match the electrical output to electronic stages. A power supply 235 provides a low bias voltage to the PIN photodiode to reduce shunt capacitance and improve temporal response.

Figure 6:
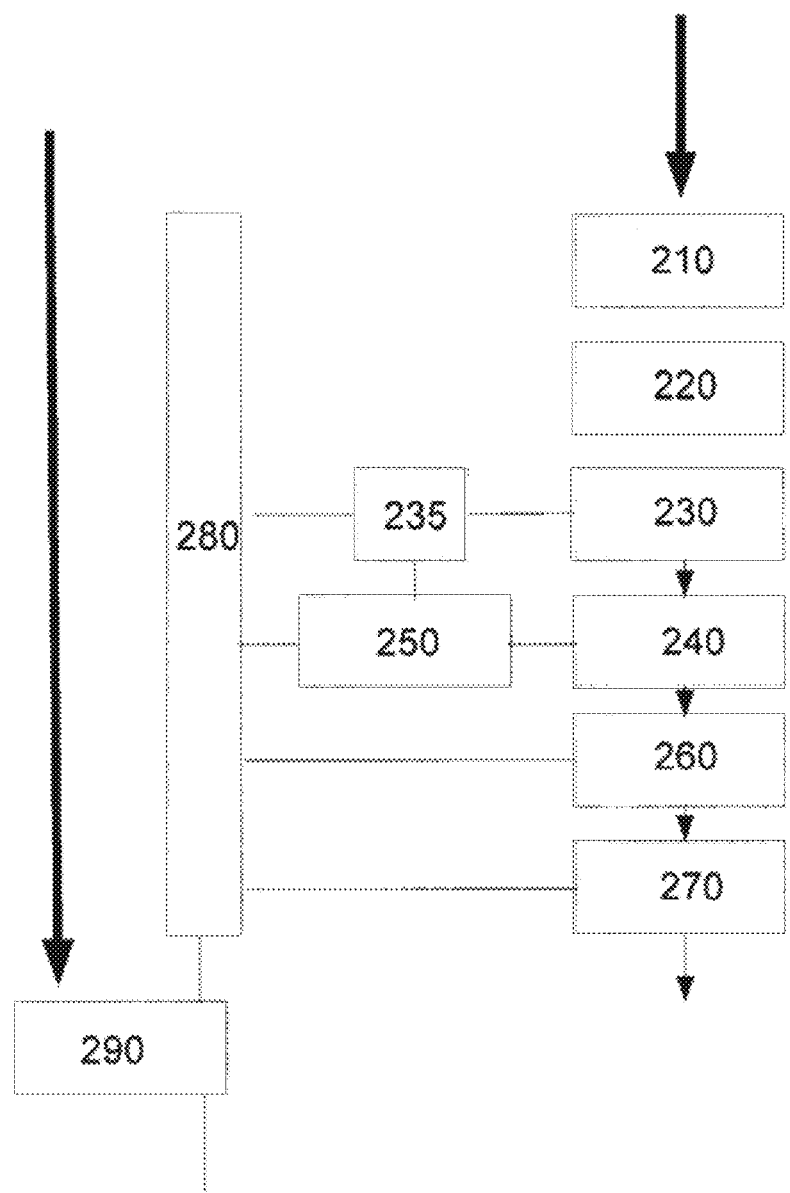
Figure 7:
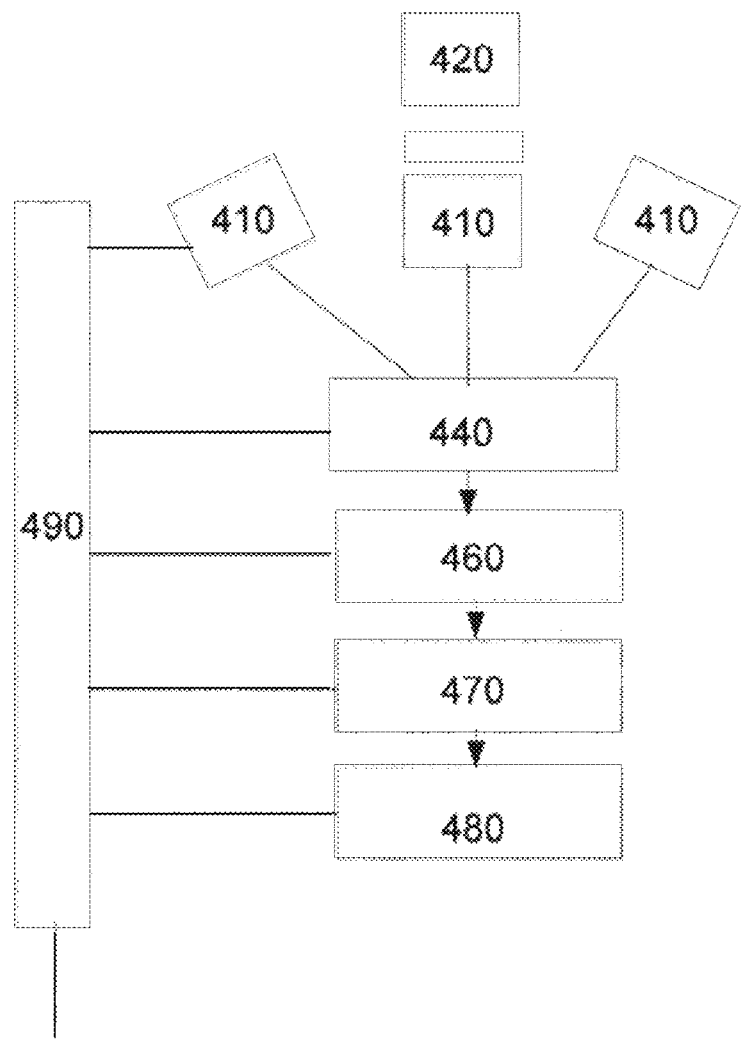

In some embodiments, e.g., as illustrated in FIG. 6, using an avalanche photodiode as the optical detector 230 the power supply 235 would be of a higher voltage to drive the photodiode into the avalanche regime and provide electronic gain. In this embodiment the power supply 235 would typically have a temperature sensor (such as a thermistor) to monitor the avalanche photodiode temperature and automatically adjust the voltage output to compensate for temperature dependence in the avalanche voltage of the avalanche photodiode. In this embodiment the amplifier module 240 may also provide a small fraction of the amplified electrical signal to an automatic gain control module 250 which integrates the electrical signal, conditions it and supplies it to a voltage-control input of the power supply 235, thereby controlling the voltage of the power supply 235 and thereby the gain of the avalanche photodiode to match varying light levels received at the optical detector 230 due to received transmitter light or other detected light.

The automatic gain control module may itself, e.g., in its own internal circuits, include variable gain to keep the output signal within the required range for subsequent processing (such as in the discrimination module 260).

In an embodiment using a photomultiplier tube the as the optical detector 230 a power supply 235 supplies high voltage (100-500V typical) to the photomultiplier tube in order to provide fast temporal response and electronic gain. Typically the power supply 235 in this embodiment will have a voltage control input, as in an embodiment using the avalanche photodiode, so that a similar automatic gain control module 250 can control the voltage supplied to the photomultiplier tube and thereby its electronic gain to match varying light levels received at the optical detector 230 due to received transmitter light or other detected light, as well as to protect the photomultiplier tube from damage due to high light levels.

In an embodiment that uses a photomultiplier tube at data rates above, e.g., 100 Mbps, such as 622 Mbps or 1000 Mbps, special consideration may be taken with the choice of photomultiplier tube. A very high bandwidth tube may be required, and particular care may be needed in its operation. For example, it may be necessary to utilize only the first few stages of a conventional high-speed photomultiplier tube, drawing the signal current from an intermediate dynode stage, rather than from the anode, in order to obtain fast enough rise and fall times to support the high bit rate. In an additional embodiment a photomultiplier tube which uses a micro-channel plate as the electronic gain medium in lieu of a conventional dynode structure may be used. In a further embodiment, a hybrid photodiode may be used, a device which combines a vacuum stage operating at high voltage followed by an internal semiconductor avalanche structure may be used to provide a significant photosensitive area and electronic gain while supporting the bandwidth required for, e.g., 1000 Mbps operation. In another embodiment, a vacuum photodiode, which provides a large collecting area and high speed without internal electronic gain may be used, provided that sufficient gain can be provided in subsequent electronic amplification stages.

The output of the amplifier module 240 is conveyed to a discrimination module 260 which detects the amplified waveform using a waveform detection module which may include, e.g., Schmidt triggers, clocks and other circuits to convert the detected waveform into a signal that can be conveyed to the data conversion module 270 which converts the data format created by the discrimination module 260 from the detected optical waveform into a non-optical format useable for an external data recipient located on the host platform.

A power supply 280 is provided to condition input power from the platform hosting the transmitter 100 and provide the required voltages and currents to power the various electronic modules of the receiver 200. This power supply 280 may typically be a high-efficiency, low-noise switching supply, with one or more outputs.

In the case of infrequent data exchanges, a power control module 290, which uses an optical detector and a low-powered circuit with an amplifier, electronic filter, a threshold circuit and a relay or electronic switch may be provided to sense the proximity of a remote transmitter and activate the local transmitter and receiver by connecting the input power between the power supply 170/280 and the power source on the platform.

In the embodiment illustrated in FIG. 2 the transmitter 100 and the receiver 200 will be collocated in a pressure vessel 300 in order to isolate the transmitter 100 and receiver 200 from contact with the aqueous environment. In this embodiment windows 310 will be provided to convey light from the transmitter 100 into the aqueous medium and to a remotely mounted receiver, and from a remotely mounted transmitter through the aqueous medium to the receiver 200. These may typically be separate windows for the transmitter and receiver, but can also be a single window serving both transmitter and receiver.

In an embodiment in which the directions of the transmitter beam and/or receiver field of view must be moved during operation (such as for communication between a moving and a stationary transceiver) an element is provided that senses the direction of a remote transmitter and generates control signals for a gimbal or other mechanical device that translates the pointing angle of the transmitter or receiver, or for an electronic pointing angles translator. FIG. 6 shows one embodiment, useful for the case where the angular directions must be controlled in one dimension only, in which an array of optical detectors 410 are pointed in different angles to sense the incoming transmitter beam. The optical detectors are provided with optical filters 415 (or other wavelength selective elements) to transmit light from the remote transmitter and reject backscattered light from the local transmitter. The optical detectors may also be provided with lenses 420 or another optical element capable of defining the optical detector field of view. The electrical signal from the optical detectors 410 is conveyed to an amplifier module 440. The amplifier module 440 will typically include automatic gain control in order to maintain the output signal within the range of voltage levels useable by following stages. The electrical output from the optical detectors is conveyed to a guidance processor module 460 which measures the signal strength from each optical detector and calculates the direction of the remote transmitter. The calculation can be accomplished for coarse direction by taking the ratios of the strengths of the optical signals using either a system of operational amplifiers or by using an actual analog to digital conversion and performing the calculation in a microprocessor system. A more precise calculation of the direction of the remote transmitter can be accomplished in a microprocessor by taking into account the geometry of the detectors and the amount of remote transmitter light that will be intercepted by them as a function of angle.

Figure 8:
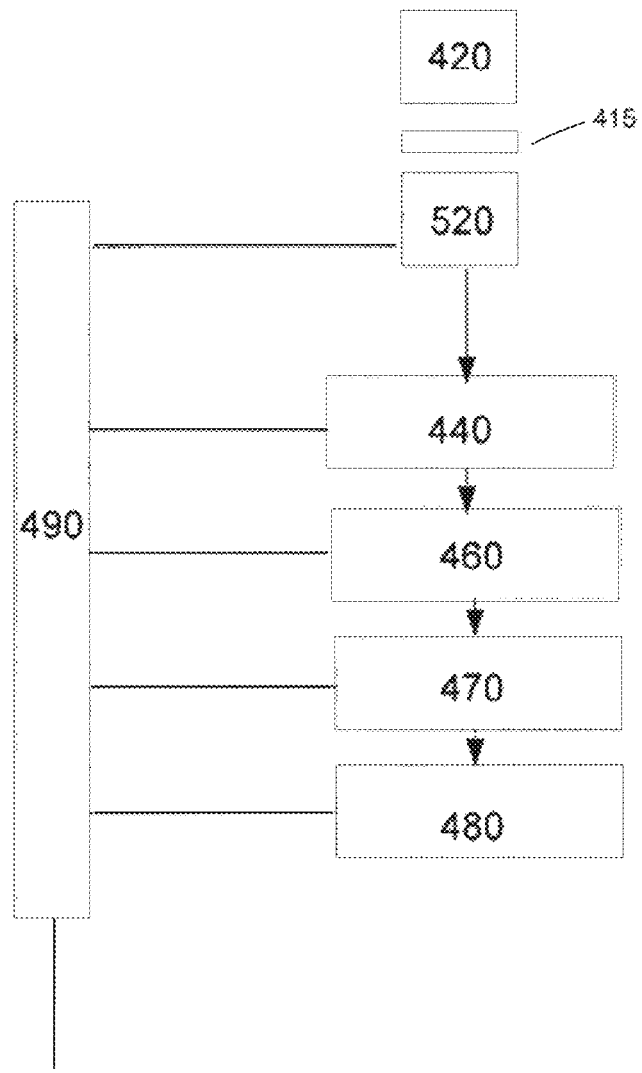

Another embodiment illustrated in FIG. 8 uses a position-sensitive optical detector 520 such as a position-sensing semiconductor photodiode (e.g., a split photodiode), position-sensing (e.g., resistive anode) photomultiplier tube, or a multiple-anode photomultiplier tube with a voltage divider circuit to provide the angular location of the remote transmitter. An imaging optical element 410 such as a lens is used to convert the angle of the incoming transmitter light into a position on the active area of the positions-sensitive optical detector 520. An optical filter 415 can be used to transmit light from the remote transmitter and reject ambient background light and backscattered local transmitter light. The electrical output of the position-sensitive detector 520 is conveyed to an amplifier module 440 and the output of the amplifier module 440 conveyed to a guidance processor module 460 for the generation of guidance signals. The guidance signals generated from this embodiment are accurate enough for precision platform guidance, if needed.

In addition to wavelength-selective optical filter 415, in order to reject background light (such as sunlight when the transceivers are shallow) an electronic filter may be included either in the amplifier module 440 or in the guidance processor module 460 in order to reject steady or slowly varying (un-modulated) optical signals and accept the modulated signal from the remote transmitter.

The output of the guidance processor module 460 is conveyed to a drive module 470 which provides electrical signals to a motor driven gimbal 480 (or other positioning device) on which are mounted the transmitter and receiver such that an electrical signal from the drive module 470 translates the angle of the transmitter and receiver relative to the housing. A power supply 490 is provided to condition power from the platform and provide the required voltages and currents to the respective modules.

Figure 9:
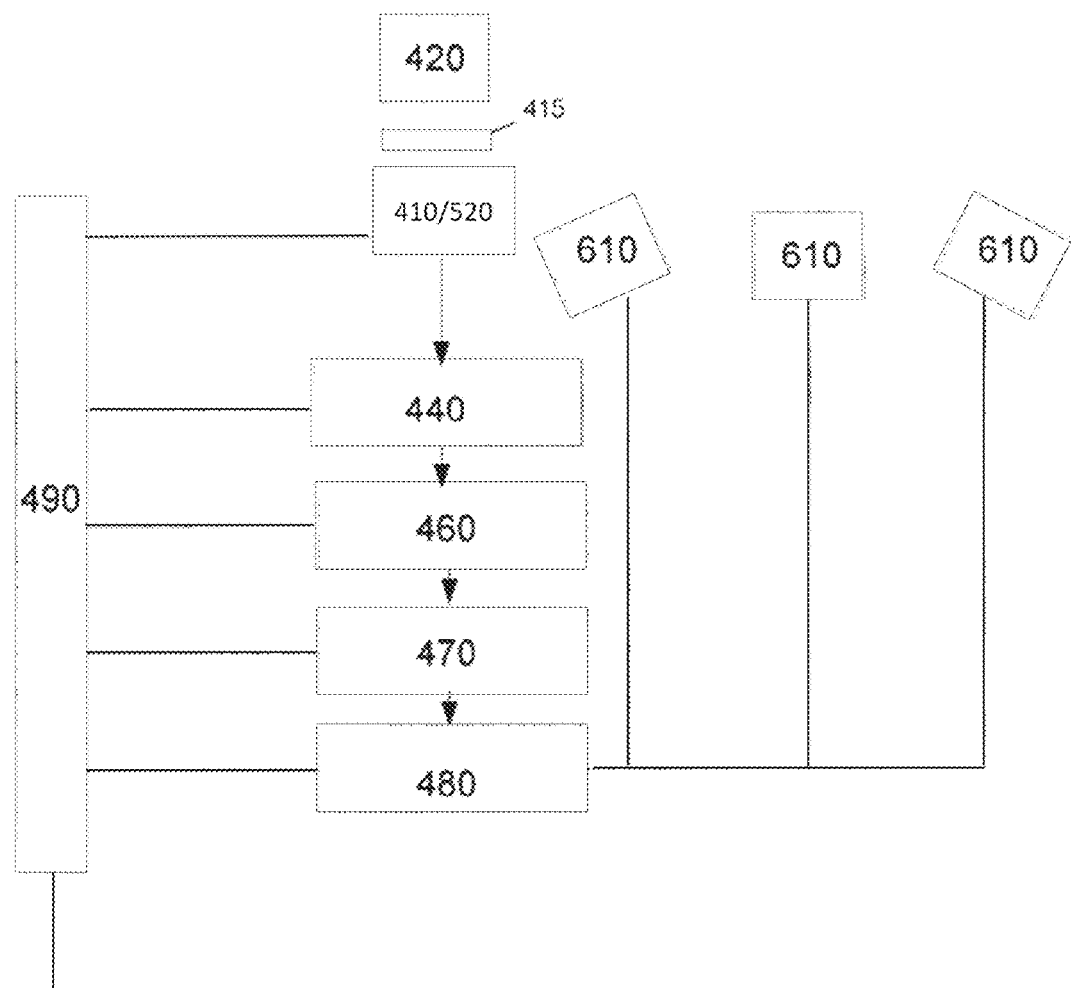

Another embodiment illustrated in FIG. 9 uses the output of the guidance processor module 460 to select angularly separated transmitter light sources or light source arrays 610 so as to project a transmitter beam into the desired direction. Another embodiment uses the output of the guidance processor to switch the output of a multiple-anode photomultiplier tube used as the optical detector so as to select the direction for which an incoming light beam will be sensed.

In some embodiments, the transceivers described herein may use channel coding techniques to increase link robustness and transmission rates. For example, low-density parity-check, LDPC, codes and rate adaptive channel codes may be used.

In some embodiments, the transceivers described herein may implement dynamic optimization of the transmission parameters. In underwater environments such as seismic sensing, the local water conditions can vary significantly. In order to accommodate the variation the optical links are dynamically configured to measure link loss mechanisms, alone or in combinations with other effects such as dispersion, and assign an optimal data rate. In addition, if the underwater environmental conditions permit, multi-carrier modes can be initiated. Local Digital Signal Processing, DSP, can be performed to adjust or compensate for the applicable transmission-reception parameters, or software can implement the communication control adjustments. The optical transmission receiver linkage can be monitored continuously in order to maintain link performance.

In some embodiments, receivers of the type herein may be used to transmit seismic data, e.g., from an autonomous underwater seismic node to a retrieval device. The retrieval device may be mounted on, for example, an submarine vessel, a remotely operated vehicle, or an autonomously operated vehicle. In some embodiments, the seismic data transfer may be performed at a rate of at least 10 Mbps, 100 Mbps, 500 Mbps, 1000 Mbps or more. In some embodiments, the transmission link is maintained for at least 1 second, 10 seconds, 1 minute, 5 minutes, 10 minutes, 20 minutes, 30 minutes, 40 minutes, 50 minutes, 1 hour, or more. In some embodiments, the transmission occurs over a distance of at least 10 cm, 100 cm, 1 m, 2 m, 3 m, 5 m, 10 m, 20 m, 100 m or more.

Although in many embodiments (e.g., as described herein) it is advantageous to used wavelengths in the range of 400-600 nm (or any subrange thereof), in other cases depending on the application at hand any other suitable wavelengths may be used (e.g., wavelengths in the range of 300 nm to 1400 nm).

Figure 10:
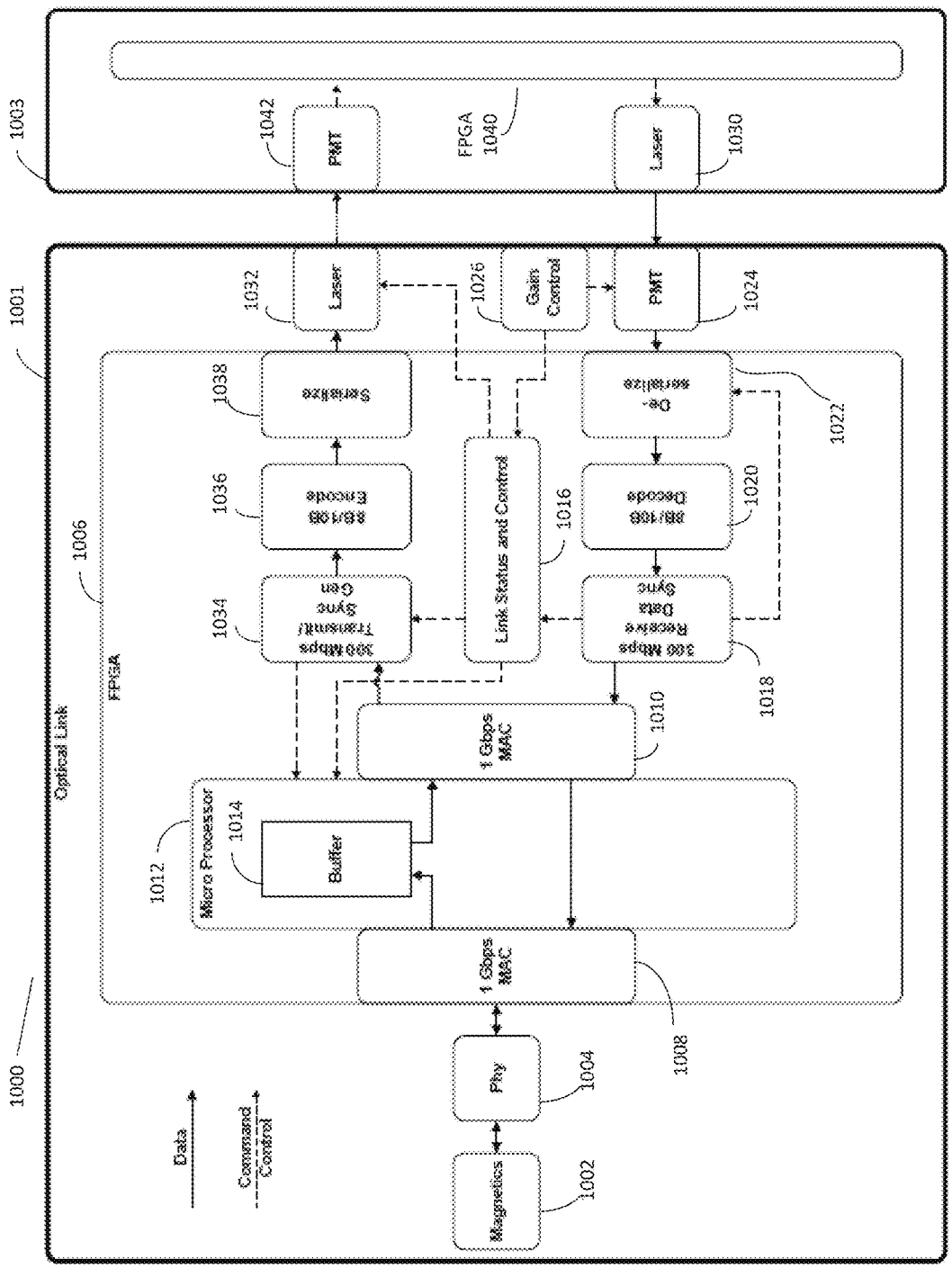
FIG. 10 is an illustration of a system to perform seismic exploration in an aqueous environment using optical transmission, in accordance with an embodiment.

FIG. 10 is an illustration of a system 1000 to perform seismic exploration in an aqueous environment using optical transmission. In some embodiments, the system 1000 includes a first optical link 1001 that transmits and receives optical signals to/from or between a second optical link 1003. In some embodiments, the first optical link 1001 and the second optical link 1003 can include one or more of the same components. The one or more same components may be configured in a complimentary manner such that the transmission component of the first optical link 1001 is configure to transmit optical signals to a receiving component of the second optical link 1003.

In some embodiments, the first optical link 1001 includes a magnetic module 1002 configured to isolate voltages in an Ethernet network connection. The magnetic module 1002 can isolate voltage so that equipment operating from different voltage sources can coexist on a single network. In some embodiments, where one or more components of system 1000 or other network components are powered from the same power supply, it may not be necessary to include the magnetics module 1002. In some embodiments, the magnetics module 1002 includes one or more transformers configured to blocks DC and low frequency voltages. In some embodiments, the magnetics module 1002 is a hardware module that is external to the PCB, and not part of the FPGA. In some embodiments, the magnetics module 1002 may be internal to the FPGA or otherwise communicatively coupled to the FPGA to facilitate systems and methods of performing seismic exploration using optical transmissions.

In some embodiments, the system 1000 includes a phy module or "physical layer" module 1004. The phy module 1004 may refer to a low layer (e.g., or a lowest layer) in an Open Systems Interconnection model of a network. The phy module 1004 is configured to transmit and receives signal based on one or more specifications such as Ethernet, WiFi, WiMax, Bluetooth, Near Field Communications, etc. In some embodiments, the phy module includes one or more chips on one or more circuit cards that are external the FPGA. In some embodiments, the phy module 1004 may be internal to the FPGA or otherwise communicatively coupled to the FPGA to facilitate systems and methods of performing seismic exploration using optical transmissions.

In some embodiments, the system 1000 includes an FPGA 1006 (e.g., a field-programmable gate array having one or more integrated circuits that can be configured to facilitate seismic exploration in an aqueous environment). In some embodiments, the FPGA 1006 can include one or more Media Access Controller (MAC) (e.g., a first MAC 1008 and a second MAC 1010). The first and second MACs 1008 and 1010 can represent the second layer of the Open Systems Interconnection model. The first and second MACs 1008 and 1010 can be configured to perform one or more of the following functions: receive/transmit frames, retransmit and backoff functions, inter-frame gap enforcement, and discard malformed frames. In some embodiments, the first MAC 1008 (or topside MAC) can transmit and receive data via an Ethernet connection (e.g., the Phy 1004 and magnetics 1002), and the second MAC 1010 (or bottomside MAC) can transmit and receive data via an optical connection.

In some embodiments, the FPGA 1006 includes a micro-processor 1012. The micro-processor 1012 can be communicatively coupled to the first and second MACs 1008 and 1010, respectively. The micro-processor 1012 can be configured to receive data frames from a host and buffer the data frames until the system is ready for the data frames. The micro-processor 1012 may include or have access to memory configured to store the received the data frames. The amount of memory may be sufficient to store relatively large amounts of data sufficient to facilitate systems and methods of performing seismic exploration using an optical link. In some embodiments, the micro-processor 1012 is further configured to send data to the second MAC 1010 when the Link Status and Control module 1016 determines that both receivers are receiving valid data.

In some embodiments, the FPGA 1006 includes a buffer 1014 that is accessible to the micro-processor 1012. The buffer 1014 may include memory that is used by the micro-processor 1012 to save data frames until the second MAC 1010 is ready to transmit the data frames.

In some embodiments, the FPGA 1006 includes a receive data sync module 1018. The receive data sync module 1018 can build data frames from the data received from a decoder 1020 (e.g., a 8B/10B decoder) and also provide synchronization information to the Link Status and Control block 1016. The frames are built by receiving data until an interframe gap is detected. When the interframe gap is detected, the frame is sent to the second MAC 1010 (e.g., at a rate of 1 Gbps). The interframe gap can include specific control characters transmitted by the second optical link 1003 and decoded by the decoder 1020. These control characters can include optical signal strength information reported by the second optical link 1003. In some embodiments, synchronization data reported to the Link Status and Control block 1016 can indicate, for example: (1) a receiver is not currently synchronized to the incoming data stream or there is no data stream; (2) a receiver is synchronized to the incoming data stream, but the information in that data stream in the form of control characters indicates that the other side's receiver is not synchronized to our transmitter; or (3) a receiver is synchronized to the incoming data stream, and the information in that data stream in the form of control characters indicates that the other side's receiver is also synchronized to our transmitter.

In some embodiments, the optical link 1001 or FPGA 1006 can include a decoder 1020, such as an 8B/10B decoder. The decoder 1020 can receive data from a de-serializer 1022 and converts the data into 8 bit data characters of 8 bit control characters using the 8B/10B encoding scheme. The decoder 1020 can synchronize to the data stream upon command using control characters in the data stream. In some embodiments, the decoder 1020 can be configured to decode data using other decoding techniques that facilitate performing seismic exploration using an optical link in an aqueous environment.

In some embodiments, the optical link 1001 or FPGA 1006 can include a de-serializer 1022. The de-serializer can receive a serial data stream and produce data (e.g., 10 bit parallel data) suitable for use by the decoder 1020. In some embodiments, the de-serializer 1022 determines the edges of the received data pulses and adjusts a clock to latch the data at a suitable point in the data waveform, which may correspond to the center of an eye pattern. In some embodiments, when the receive data synchronizer 1018 sends a synchronize command, the de-serializer 1022 can attempt to synchronize with an input data stream using control characters of the synchronization process. The synchronization process may be is repeated responsive to a command from the receive data synchronizer 1018.

In some embodiments, the optical link 1001 includes a photo multiplier tube (PMT) 1024. The PMT 1024 can be communicatively coupled to the FPGA 1006, while being external to the FPGA. The PMT 1024 can include associated circuitry that converts incident or received light to electrical signals suitable for amplification. In some embodiments, the PMT 1024 can include or be communicatively coupled to the optical receivers 200 of FIG. 2. In some embodiments, the PMT 1024 can include or be communicatively coupled to the multi-anode PMT 410 of FIG. 4.

In some embodiments, the optical link includes a gain control 1026. The gain control 1026 can include a circuit or other hardware that adjusts the gain of the PMT so that a suitable electrical signal can be produced from the incident light. In some embodiments, the gain can be adjusted based on anode current measured from the PMT and the magnitude of the data waveform on the signal chain. The gain can be adjusted by increasing or decreasing the bias voltage on the tube. The gain required to get the desired signal is also sent to the link status and control block 1016. The gain may also be sent to a transmit/sync generator block 1034, which may send the information to the second optical link 1003 using control characters in the interframe gap. The second optical link 1003 can adjust transmit power based on this information to maintain a reliable link over a wide range of optical conditions.

The first and second optical links 1001 and 1003 can include one or more lasers 1030 and 1032 (e.g., optical transmitters 100 of FIG. 2), respectively, that produce an amplitude modulated optical signal containing digital information. For example, the laser 1032 can produce an optical signal containing digital information received from serializer 1038. The optical signal can be modulated by modulating the current through the laser 1030 and 1032. The magnitude of the discrimination current, and therefore the light discrimination, can be adjusted via commands from the link and status control module 1016. For example, the magnitude and discrimination can be adjusted to compensate for optical conditions (e.g., murkiness, turbidity, or murkiness of the aqueous medium).

In some embodiments, the optical link 1001 or FPGA 1006 can include a serializer 1038. The serializer 1038 can receive data (e.g., parallel data) from an encoder 1036 (e.g., 8B/10B encoder) and send a data stream (e.g., serial data stream) to the laser 1032.

In some embodiments, the optical link 1001 or FPGA 1006 includes an encoder 1036. In some embodiments, the encoder 1036 may include an 8B/10B encoder that converts an 8 bit data stream to a DC balanced 10 bit data stream. The data can be any of 256 possible 8 bit data values or one of 16 control characters.

In some embodiments, the first optical link 1001 or FPGA 1006 includes a transmit sync generator 1034. The transmit sync generator 1034 can receive data (e.g., at a data rate of 1 Gpbs) from the second MAC 1010. The transmit sync generator 1034 can buffer the data using a first in first out memory, and send the data out at a second data rate (e.g., 300 Mbps) to the encoder 1036. The transmit sync generator 1034 can send a signal to the microprocessor 1012 indicating that the transmit sync generator 1034 is ready to receive more data from the second MAC 1010. The transmit sync generator 1034 can facilitate synchronization by the second optical link 1003 by sending synchronization data. The transmit sync generator 1034 can receive a command from the link status and control module 1016 indicating to send the synchronization data to the second optical link 1003. In some embodiments, the transmit sync generator 1034 can send, to the second optical link 1003, received signal strength information in the inter-frame gaps so that the second optical link 1003 can adjust its laser light discrimination.

In some embodiments, the first optical link 1001 or FPGA 1006 includes a link status and control module 1016 that monitors the link status, directs adjustments to transmitter power, or initiates synchronization. For example, the link status and control module 1016 can determine when the transmitter should send sync characters based on the sync status received from the second optical link 1003. If the second optical link 1003 reports that it is not synchronized or no signal is received from the other side, the link status and control module 1016 can facilitate sending synchronization characters. In some embodiments, the link status and control module 1016 can determines the signal strength information the transmitter will send to the other side based on the required PMT gain. In some embodiments, the link status and control module 1016 can set the laser discrimination level based on signal strength information received from the second optical link 1003. In some embodiments, the link status and control module 1016 can provide link state information to the micro-processor 1012. The microprocessor 1012 may then provide the link state information it upon request to a host device.

Figure 11:
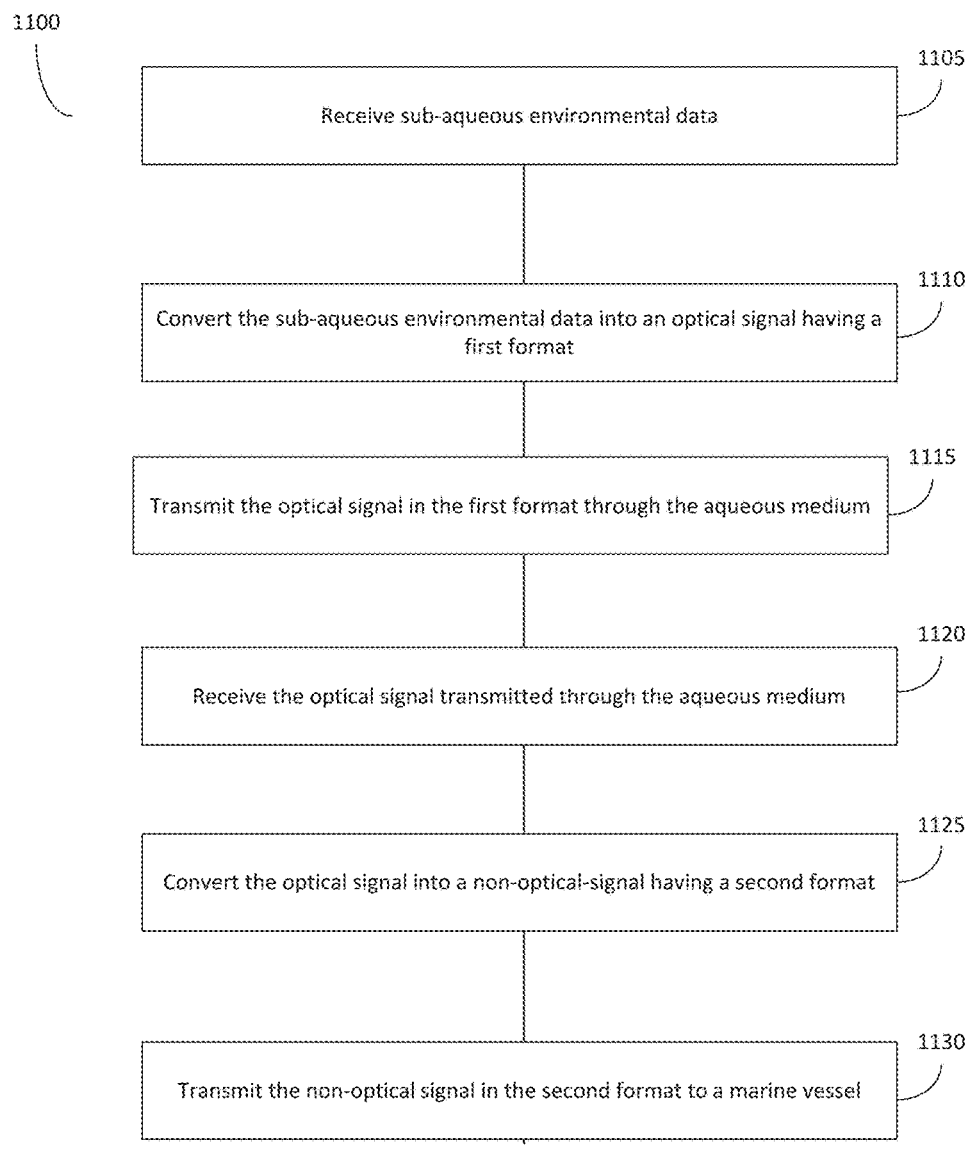
FIG. 11 is an illustration of a method of performing seismic exploration in an aqueous environment using optical transmission, in accordance with an embodiment.

FIG. 11 illustrates an embodiment of a method 1100 of performing seismic exploration in an aqueous medium. The method 1100 can be performed by one or more systems or components illustrated in FIGS. 2-10 in the environment illustrated in FIG. 11. For example, the method 1100 can be performed using FPGA 1006 of FIG. 10 and transceivers 10 and 20 of FIG. 2.

In some embodiments, the method 1100 includes receiving sub-aqueous environmental data of a first ocean bottom seismometer (OBS) unit (e.g., a sensor device 30 of FIG. 1) disposed in the aqueous medium (1105). Sub-aqueous environmental data may include, for example, one or more of seismic data, underwater creature data, turbidity data, water quality data, water current data, water opacity data, water temperature data, etc. The OBS unit may receive the sub-aqueous environmental data using one or more sensors disposed within the OBS unit or one or more sensors external to the OBS. The one or more sensors may include, for example, a geophone, an accelerometer, a gyroscope, a scale, etc. In some embodiments, the OBS unit may be placed at or near an ocean floor or seabed. In some embodiments, the OBS unit may be in contact with, placed on, partially buried or otherwise coupled to the ocean floor. In some embodiments, the OBS unit may be coupled to the seabed via a spike, while in other embodiments the OBS unit may be placed on the ocean floor (e.g., the OBS unit may include a disk-shaped case where a bottom surface is substantially flat and configured to sufficiently couple with the ground or seabed such that a geophone disposed within the OBS unit can receive seismic data).

In some embodiments, the sub-aqueous environmental data includes data indicating at least one of seismic activity, dissolved solids in the aqueous medium, dissolved minerals in the aqueous medium, a state of the aqueous medium, oxygen concentration in the aqueous medium, salt concentration in the aqueous medium, plankton concentration in the aqueous medium, turbidity of the aqueous medium, and animal presence in the aqueous medium. The OBS unit may include (internally or externally) or have access to one or more sensors configured to receive, identify, determine or otherwise obtain the sub-aqueous environmental data.

In some embodiments, the method 1100 includes converting the sub-aqueous environmental data into an optical signal (1110). The optical signal can be formatted for optical transmission in the aqueous medium. For example, a data conversion module of the OBS unit can convert the sub-aqueous environmental data received by the OBS unit into a first format having one or more channel coding techniques. The channel coding techniques may include, for example, on-off keyed format, 8b/10b encoding, pulse-position discrimination, Quadrature Phase Shift Keying (QPSK), and Quadrature Amplitude Discrimination. In some embodiments, the first format can include or be associated with one or more parameters such as a frequency, data rate, wavelength, angle, bandwidth, intensity, photon density, etc. For example, the method 1100 may include using one or more components of system 1000 such as a microprocessor 1012, MAC 1010, transmit/sync generator 1034, encoder 1036 or serializer 1038 to convert or transmit the sub-aqueous environmental data into an optical signal.

In some embodiments, the method 1100 includes transmitting the optical signal in the first format through the aqueous medium (1115). For example, an optical transmitter of the OBS unit can be configured to transmit the optical signal in the first format through the aqueous medium. The optical signal can be transmitted based on the first format, one or more parameters, or a channel coding technique. In some embodiments, the method 1100 includes the transmitting the optical signal using a light source or other optical transmitter such as a solid state light source, an InGan based light source, a laser or an LED. In some embodiments, the optical transmitter may be a component of a transceiver, such as transceiver 10 or 20 illustrated in FIG. 2.

In some embodiments, the method 1100 includes transmitting the optical signal using a single-carrier transmission discrimination technique. In some embodiments, the method 1100 includes transmitting the optical signal using a multi-carrier discrimination technique. For example, the multi-carrier discrimination technique may include multiplexing techniques. In some embodiments, the multi-carrier transmission technique may include an optical Orthogonal Frequency Division Multiplexing technique.

In some embodiments, the data rate of the optical signal transmitted through the aqueous medium can range from about 10 Mbps to about 300 Mbps. In some embodiments, the data rate can range from about 10 Mbps to about 1 Gbps. In some embodiments, for example in certain types of monitor unit, lower data rates as low as 10 Mbps or 100 Mbps may be used.

In some embodiments, the method 1100 includes receiving the optical signal transmitted through the aqueous medium. For example, an optical receiver of at least one of a remotely operated vehicle (ROV), autonomous underwater vehicle (AUV), or autonomously operating vehicle (AOV) can receive the optical signal. The method 1100 may include receiving the optical signal via optical receivers 200 or transceivers 10 or 20 illustrated in FIG. 2 or using PMT 1024 illustrated in FIG. 10.

In some embodiments, the method 1100 may include converting the optical signal transmitted through the aqueous medium into a non-optical signal having a second format (1125). In some embodiments, the non-optical signal may refer to an electrical signal that can be transmitted via a wire or cable. In some embodiments, the non-optical signal includes the electrical signal configured for transmission through a fiber optical cable or other cable to a marine vessel (e.g., a ship at the surface of the ocean).

In some embodiments, the second format of the non-optical signal or electrical signal transmitted through the aqueous medium is different than the first format of the optical signal. For example, the second format of the electrical signal may include a data rater that is higher than a data rate of the first format of the optical signal. The data of the second format may be higher because the electrical signal or non-optical signal is transmitted through a cable, rather than optically through the aqueous medium.

In some embodiments, the method 1100 includes a plurality of OBS units transmitting one or more optical signals through the aqueous medium. For example, a first OBS unit may transmit an optical signal through the aqueous medium to a second OBS unit. The second OBS unit may receive the optical signal and transmit another optical signal to a third OBS unit through the aqueous medium. In some embodiments, one of the OBS units may transmit an optical signal to an ROV, AUV or AOV or some other access point through the aqueous medium. The ROV, AUV, AOV or other access point may then convert the received optical signal to a non-optical signal, and transmit the non-optical signal via a cable or wire to the marine vessel or other device that facilitates transmitting data to the surface of the ocean.

In some embodiments, the first OBS unit transmits a first optical signal to a second OBS unit, and the second OBS unit transmits data of the first optical signal in addition to data of the second OBS unit to an ROV, AUV, AOV or other access point. Thus, the plurality of OBS units can aggregate data transmitted via optical signals through the aqueous medium to facilitate conveying the data to an ROV or other device capable of transmitting the data via a non-optical signal and wire to the surface of the ocean.

In some embodiments, the method 1100 includes determining a characteristics of the aqueous medium in order to adjust a parameter or coding technique associated with transmitting the optical signal. The characteristic can include at least one of a turbidity metric, a water quality, a water current and an opacity. In some embodiments, the method can include using the amount of light detected at the receiver to measure the amount of light at the receiver and thereby discern the water clarity (e.g., turbidity) and/or the distance between the transmitter and receiver. Since the photocurrent at the output of a detector will be approximately equal to the product of the optical power at the photosensitive element (such as the photocathode), the efficiency of converting the optical power into photoelectrons (the quantum efficiency) and the gain of the detector, such a measurement can be accomplished by measuring the output current from the photodetector (the PIN diode, Avalanche Photodiode (APD), Hybrid Photodetector (HPD, vacuum photodiode, dynode-type photomultiplier or Microchannel-Plate (MCP)-type photomultiplier, etc.) and also the gain of the photodetector (as manifested by the bias voltage(s) for the APD, HPD or photomultiplier) and the gain of any amplifier elements.

Another embodiment will use the measurement of the optical power as described in the preceding paragraph to vary the data rate to ensure a low rate of errors and the maximum effective rate of data transfer. Under conditions where the received transmitter power is weak, due to turbidity, distance between the transmitter and receiver, fouling or debris at the window, etc., the data rate can be reduced so that the number of photons per bit is increased, shot noise at the receiver is reduced, and the error rate is thereby reduced. In some embodiments, an output intensity of the optical signal can be increased. In some embodiments, a wavelength of the light can be adjusted to improve data rate (e.g., if it is determined that one or more wavelengths of light are more likely to be absorbed or reflected off of debris in the aqueous medium).

In some embodiments, the method 1100 includes initiating an optical link between an OBS unit and at least one of the ROV and the AUV. The method 1100 can include transmitting a first optical signal from the OBS unit to the at least one of the ROV and the AUV. The ROV or AUV may determine (e.g., via a microprocessor) that a bit error rate of the first signal is satisfactory, it may determine that a bit error rate is too low. In some embodiments, the ROV or AUV may compare the bit error rate with a threshold set by an administrator of the system. In some embodiments, the method may include performing a bit error rate test using a bit error rate test pattern (e.g., a pseudorandom binary sequence, quasi random signal source, 3 in 24, 1:7, Min/Max, all ones, all zeros, alternating 0s and 1s, 2 in 8, bridgetap, multipat, or T1-DALY and 55 OCTET). In some embodiments, the bit error rate threshold may, for example, range from about 1e-2 to about 1e-8. In some embodiments, the bit error rate threshold may range from about 1e-3 to about 1e-4.

In some embodiments, the method 1100 can include transmitting a second optical signal having a second data rate that is greater than the first rate. The method 1100 may include selecting the second data rate to be higher than the first data rate responsive to determining that the bit error rate of the first signal satisfies the threshold. For example, if the bit error rate of the first signal is relatively good (e.g., 1e-4 or lower), then the method 1100 may include selecting a second data rate that is higher than the first rate. In some embodiments, the method 1100 may include selecting a second data rate based on the bit error rate (e.g., if the bit error rate is relatively low, then the second data rate may be a multiple of the first bit error rate such as twice the first data rate).

In some embodiments, the method 1100 includes determining that the bit error rate is less than a threshold or otherwise does not satisfy the threshold (e.g., the bit error rate is too high). In this case, the method 1100 may include selecting a second data rate that is less than the first data rate (e.g., the second data rate may be about 10% to about 90% of the first data rate).

In some embodiment, an automatic gain control can be used to provide a slow-start function. Automatic gain control can to allow the receiver to function in an optimal range of sensitivity over a range of received transmitter powers. A slow-start can protect a photodetector (e.g., an optical receiver) that has a voltage-dependent gain, such as an APD, HPD, dynode-type photomultiplier or MCP-type photomultiplier. These photodetectors may be damaged by operation at high light levels or gains. Thus, an automatic gain control that starts by default from a low gain may prevent damage of the photodetector. In some embodiments, the slow-start automatic gain control can be implemented in hardware using a timing circuit. In some embodiments, the slow-start automatic gain control can be implemented in software for greater flexibility if the transceiver already includes a microcontroller or other processor system for other functionality, such as measuring the received transmitter power, varying bit rates, etc.

Figure 12:
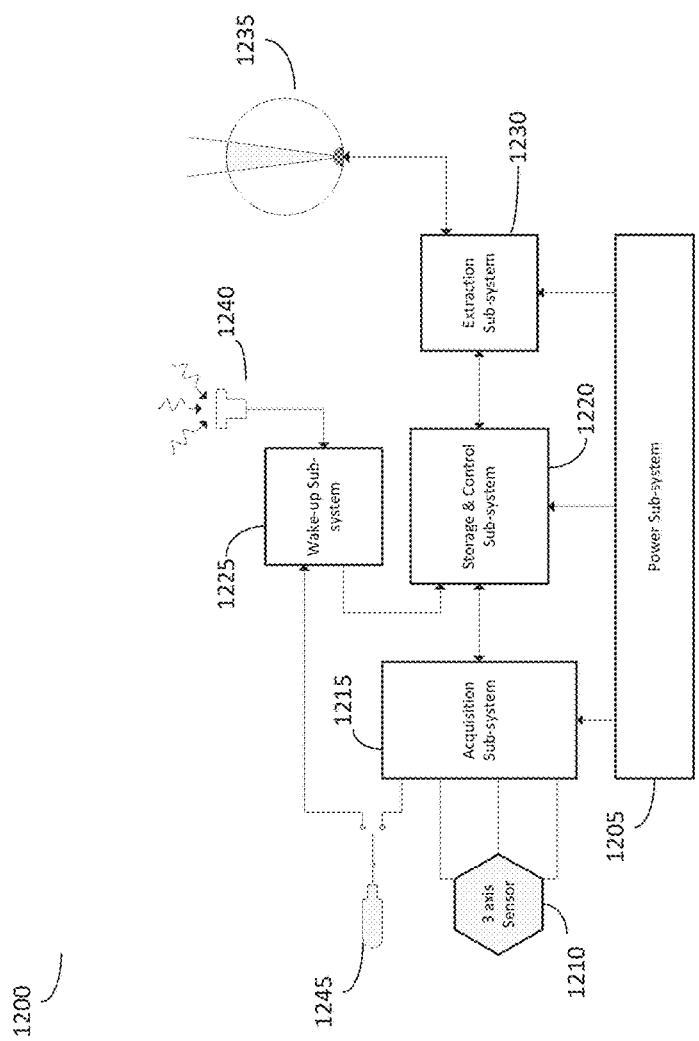
FIG. 12 is an illustration of a system for powering an optical system for performing seismic exploration in an aqueous environment.

FIG. 12 is an illustration of a system 1200 for powering an optical system for performing seismic exploration in an aqueous environment. In some embodiments, system 1200 includes a wake-up sub-system 1225 configured to perform a detect process that can consume low energy (e.g., from about 0 watts to about 1 watts) and a validate process. The system 1200 can determine whether a communications link (e.g., an optical link) has been properly established and is performing correctly (e.g., using quality control parameters such as bit error rate, or other handshaking protocols). In some embodiments, the energy consumption may be on the order of a hundred micro watts. In some embodiments, the system 1200 can use little to no energy by drawing energy from the impinging wave/signal, be it acoustic or optic. For example, the system 1200 can be driven by wave energy, light energy, sound energy, or chemical reactions. In some embodiments, the wake-up sub-system 1225 can draw energy from light provided by an ROV, AUV, or AOV or other light source. In some embodiments, a specialty, custom made or other separate battery can power the wake-up sub-system 1225. This separate battery may be different from the power-sub system 1205. In some embodiments, the wake-up sub-system 1225 can facilitate a zero power startup or very low power startup.

In some embodiments, the system 1200 includes a power sub-system. The power sub-system can be provide power to one or more component of the system 1200 including, for example, the 3 axis sensor 1210, acquisition sub-system 1215, storage and control sub-system 1220, extraction sub-system 1230 and wake-up sub-system 1225. In some embodiments, the power sub-system 1205 includes a fuel cell, battery pack, capacitor, or other energy storage device. In some embodiments, the power sub-system can be rechargeable. In some embodiments, the power sub-system 1205 may not provide power to the wake-up sub-system 1225 (e.g., the power sub-system 1205 may not be coupled to the wake-up sub-system 1225).

In some embodiments, the system 1200 includes a 3 axis sensor 1210. The 3 axis sensor can determine, detect or otherwise identify an orientation of the system 1200 or device including the system 1200 (e.g., an OBS unit or other device in an aqueous medium). The 3 axis sensor can determine identify a change in an orientation, movement of the sensor device or other parameter associated with an axis or orientation of the system 1200. The 3 axis sensor can be communicatively coupled to an acquisition sub-system 1215 and provide data to the acquisition sub-system 1215.

In some embodiments, the system 1200 includes an acquisition sub-system 1215. The acquisition sub-system 1215 can be configured to receive data from the 3 axis sensor 1210 and convey that data to the storage and control sub-system or the wake-up sub-system 1225. The acquisition sub-system can include one or more logic arrays, microprocessor or other circuitry to acquire and convey data between one or more component of system 1200.

In some embodiments, the system 1200 includes a storage and control sub-system 1220. The storage and control sub-system 1220 can include one or more logic arrays, microprocessor or other circuitry to acquire and convey data between one or more component of system 1200. The storage and control sub-system 1220 can be configured to communicate with the wake-up sub-system 1225 to initiate power to the various components system 1200. In some embodiments, the storage and control sub-system 1220 can facilitate monitoring life in the aqueous medium, such as fish, mammals, or other sea creatures.

In some embodiments, the system 1200 includes an extraction sub-system 1230 designed and constructed to extract data stored in, for example, in the storage and control sub-system obtained via another component of system 1200, and transmit the data via a transmitter 1235. In some embodiments, the extraction sub-system 1230 can include one or more logic array, processor or other circuits. In some embodiments, the extraction sub-system 1230 can convert the data from one format to another format for transmitting. In some embodiments, the extraction sub-system 1230 can include a power control, storage interface, link interface and processor. The link interface may be communicatively coupled to the transmitter 1235.

In some embodiments, the system 1200 includes a transmitter 1235. The transmitter 1235 may transmit data using, e.g., optical signals, radio frequency signals, or electrical signals via a wire or cable. In some embodiments, the transmitter 1235 may include an Ethernet link or other interface to transmit data.

In some embodiments, the system 1200 includes a detector 1240 communicatively coupled to the wake-up sub-system 1225. The detector 1240 may include a photodetector, acoustic detector, motion detector, proximity detector, magnetic detector, or other sensor that facilitates providing an indication to the wake-up sub-system 1225 to wake up or power on one or more component of system 1200 or another system for performing seismic exploration.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A system to perform seismic exploration in an aqueous medium, comprising:
    an ocean bottom seismometer (OBS) unit placed on a seabed to receive seismic data;
    a data conversion module of the OBS unit to convert the seismic data into an optical signal with a first format configured for optical transmission via the aqueous medium;
    at least one of the OBS unit placed on the seabed and an underwater vehicle to:
        establish, between the OBS unit and the underwater vehicle separated from the OBS unit by the aqueous medium, an optical link through the aqueous medium; and
        determine a condition of the aqueous medium from a measurement of a characteristic of the optical link;
    a controller of the OBS unit to adjust a parameter associated with the optical signal based on the characteristic of the aqueous medium;
    an optical transmitter of the OBS unit placed on the seabed to transmit, via the optical link, the optical signal to an optical receiver of the underwater vehicle, the optical signal comprising the first format and the seismic data, the optical signal adjusted by the OBS unit based on the characteristic of the aqueous medium; and
    the underwater vehicle to:
        receive the optical signal transmitted by the optical transmitter of the OBS unit placed on the seabed via the optical link through the aqueous medium;
        convert, responsive to receipt of the optical signal, the optical signal into a non-optical signal comprising a second format; and
        provide the non-optical signal in the second format to a retrieval device.

2. The system of claim 1, comprising:
    the OBS unit comprising a geophone to receive the seismic data.

3. The system of claim 1, comprising:
    the retrieval device provided on a vessel to receive the non-optical signal in the second format.

4. The system of claim 1, comprising:
    a cable,
    wherein the underwater vehicle provides the non-optical signal to the retrieval device, the non-optical signal comprising the seismic data received from the OBS unit placed on the seabed.

5. The system of claim 1, comprising the OBS unit placed on the seabed to:
    detect a presence of the underwater vehicle; and
    enter a power up state responsive to the detection to transmit the optical signal.

6. The system of claim 1, wherein the OBS unit placed on the seabed comprises:
    a detector to provide an indication to a wake-up system to turn on one or more of a storage and control system, a sensor, or the optical transmitter;
    the wake-up system, in response to the indication from the detector, to:
        identify the optical link established between the OBS unit placed on the seabed and the underwater vehicle;
        determine a quality control parameter of the optical link; and
        validate, based on the quality control parameter, the optical link.

7. The system of claim 6, comprising the OBS unit placed on the seabed to:
    transmit, responsive to the optical link validated by the wake-up system, the optical signal to the optical receiver of the underwater vehicle.

8. The system of claim 6, comprising the OBS unit to:
    transmit, responsive to the optical link validated by the wake-up system, to the underwater vehicle, information sensed by a sensor of the OBS unit placed on the seabed.

9. The system of claim 6, comprising:
    the detector comprising at least one of a motion detector, a magnetic detector or a proximity detector.

10. The system of claim 1, wherein the parameter comprises at least one of a data rate of the optical signal, an output intensity of the optical signal, a wavelength of the optical signal, and a gain of the optical receiver.

11. The system of claim 1, comprising:
the optical receiver of the underwater vehicle further configured to sense an angle of the optical transmitter of the OBS unit; and
the underwater vehicle configured to select, based on a signal from the angle sensed by the optical receiver, an anode in a multiple-anode photomultiplier tube to align an angular field of view of the optical receiver with the optical transmitter.

12. A method of performing seismic exploration in an aqueous medium, comprising:
placing an ocean bottom seismometer (OBS) unit on a seabed;
receiving, by the OBS unit, seismic data;
converting, by a data conversion module of the OBS unit, the seismic data into an optical signal with a first format configured for optical transmission via the aqueous medium;
establishing, between the OBS unit and an underwater vehicle separated from the OBS unit by the aqueous medium, an optical link through the aqueous medium;
determining a condition of the aqueous medium from a measurement of a characteristic of the optical link;
adjusting, by a controller of the OBS unit, a parameter associated with the optical signal based on the characteristic of the aqueous medium;
transmitting, by an optical transmitter of the OBS unit placed on the seabed, via the optical link, the optical signal to an optical receiver of the underwater vehicle, the optical signal comprising the first format and the seismic data, the optical signal adjusted by the OBS unit based on the characteristic of the aqueous medium;
receiving, by the underwater vehicle, the optical signal transmitted by the optical transmitter of the OBS unit placed on the seabed via the optical link through the aqueous medium;
converting, by the underwater vehicle, responsive to receipt of the optical signal, the optical signal into a non-optical signal comprising a second format; and
providing, by the underwater vehicle, the non-optical signal in the second format to a retrieval device.

13. The method of claim 12, comprising:
receiving, by a geophone of the OBS unit, the seismic data.

14. The method of claim 12, comprising:
receiving, by the retrieval device provided on a vessel, the non-optical signal in the second format.

15. The method of claim 12, comprising:
providing a cable;
providing, by the underwater vehicle, the non-optical signal to the retrieval device, the non-optical signal comprising the seismic data received from the OBS unit placed on the seabed.

16. The method of claim 12, comprising:
detecting, by the OBS unit placed on the seabed, a presence of the underwater vehicle; and
entering a power up state responsive to the detection to transmit the optical signal.

17. The method of claim 12, comprising:
providing, by a detector of the OBS unit placed on the seabed, an indication to a wake-up system to turn on one or more of a storage and control system, a sensor, or the optical transmitter;
identifying, by the wake-up system responsive to the indication from the detector, the optical link established between the OBS unit placed on the seabed and the underwater vehicle;
determining, by the wake-up system, a quality control parameter of the optical link; and
validating, by the wake-up system, based on the quality control parameter, the optical link.

18. The method of claim 17, comprising:
transmitting, by the OBS unit placed on the seabed, responsive to the optical link validated by the wake-up system, the optical signal to the optical receiver of the underwater vehicle.

19. The method of claim 17, comprising:
transmitting, by the OBS unit responsive to the optical link validated by the wake-up system, to the underwater vehicle, information sensed by a sensor of the OBS unit placed on the seabed.

20. The method of claim 17, wherein:
the detector comprises at least one of a motion detector, a magnetic detector or a proximity detector; and
the parameter comprises at least one of a data rate of the optical signal, an output intensity of the optical signal, a wavelength of the optical signal, and a gain of the optical receiver.

* * * * *